US012308963B2

(12) United States Patent
Ivanov et al.

(10) Patent No.: US 12,308,963 B2
(45) Date of Patent: May 20, 2025

(54) POLAR CODING TECHNIQUES FOR HIGHER-ORDER MODULATION SCHEMES

(71) Applicant: QUALCOMM Incorporated, San Diego, CA (US)

(72) Inventors: Kirill Ivanov, La Jolla, CA (US); Wei Yang, San Diego, CA (US); Gabi Sarkis, San Diego, CA (US); Jing Jiang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/359,235

(22) Filed: Jul. 26, 2023

(65) Prior Publication Data
US 2025/0038887 A1 Jan. 30, 2025

(51) Int. Cl.
H03M 13/00 (2006.01)
H03M 13/13 (2006.01)
H03M 13/27 (2006.01)
H04L 1/00 (2006.01)

(52) U.S. Cl.
CPC .......... H04L 1/0071 (2013.01); H03M 13/13 (2013.01); H03M 13/27 (2013.01); H04L 1/0057 (2013.01)

(58) Field of Classification Search
CPC ...... H03M 13/13; H03M 13/27; H04L 1/0057
See application file for complete search history.

(56) References Cited

U.S. PATENT DOCUMENTS 10,498,490 B2* 12/2019 Hui ................. H04L 1/0071
10,659,195 B2* 5/2020 Zheng ............... H04L 1/0057
10,693,590 B2* 6/2020 Luo ................. H03M 13/27
11,012,185 B2* 5/2021 Jeong ............... H03M 13/134
11,070,317 B2* 7/2021 Ye ................... H03M 13/27
(Continued)

FOREIGN PATENT DOCUMENTS

WO WO-2020135616 A1 7/2020

OTHER PUBLICATIONS

International Search Report and Written Opinion—PCT/US2024/036610—ISA/EPO—Oct. 15, 2024.
(Continued)

Primary Examiner — Esaw T Abraham
(74) Attorney, Agent, or Firm — Kevin M. Donnelly; Holland & Hart LLP

(57) ABSTRACT

Methods, systems, and devices for wireless communications are described. In some examples, a transmitting device, such as a user equipment (UE) or a network entity, may encode an information bit vector into multiple code blocks using a polar code partitioned into multiple sub-blocks having a same block length in accordance with a polar transformation associated with a modulation scheme. In some examples, each code block of the multiple code blocks may be encoded using a respective sub-block of the multiple sub-blocks. Additionally, the transmitting device may interleave respective bits of each code block of the multiple code blocks using a respective interleaver of multiple interleavers. As such, the transmitting device may transmit the respective interleaved bits of each code block of the multiple code blocks over a respective bit channel of multiple bit channels, where each bit channel of the multiple bit channels is associated with a respective reliability.

30 Claims, 12 Drawing Sheets

(56) References Cited

U.S. PATENT DOCUMENTS 11,349,598 B2 * 5/2022 Hui ................... H03M 13/23
11,469,779 B2 * 10/2022 Chen ................ H03M 13/635

OTHER PUBLICATIONS

Iscan O., et al., "Polar Codes with Integrated Probabilistic Shaping for 5G New Radio", 2018 IEEE 88th Vehicular Technology Conference (VTC-Fall), IEEE, Aug. 27, 2018, 5 Pages, XP033535453, DOI: 10.1109/VTCFALL.2018.8690833 retrieved on Apr. 12, 2019, the whole document.
Qualcomm Incorporated: "Frank Polar Construction: Nested Extension Design of Polar Codes Based on Mutual Information", 3GPP TSG-RAN WG1 #88b, R1-1706674 Frank Polar Construction Nested Extension Design of Polar Codes Based on Mutual Information, 3GPP, Mobile Competence Centre, 650, Route Des, vol. RAN WG1, No. Spokane, USA, Apr. 3, 2017-Apr. 7, 2017, 25 Pages, Apr. 9, 2017, XP051252892, the whole document.

* cited by examiner

POLAR CODING TECHNIQUES FOR HIGHER-ORDER MODULATION SCHEMES

TECHNICAL FIELD

The following relates to wireless communication and, more specifically polar coding techniques for higher-order modulation schemes.

DESCRIPTION OF THE RELATED TECHNOLOGY

Wireless communications systems are widely deployed to provide various types of communication content such as voice, video, packet data, messaging, broadcast, and so on. These systems may be capable of supporting communication with multiple users by sharing the available system resources (such as, time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems, which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM). A wireless multiple-access communications system may include one or more base stations, each supporting wireless communication for communication devices, which may be known as user equipment (UE).

Some wireless communications systems may support the use of polar coding for efficient and relatively low complexity decoding of wireless communications. Polar coding involves assigning information bits to different bit channels and encoding the bits such that some bit channels are associated with increased reliability and other bit channels are associated with decreased reliability (such that respective bit channels may be "polarized" in terms of reliability). An encoder of a transmitting device may implement a polar code using a matrix associated with the polar code that polarizes copies of a channel into subchannels (which may be referred to as bit channels), which are either relatively noisy (corresponding to decreased reliability) or relatively noiseless (corresponding to increased reliability). Information bits may be mapped to the noiseless bit channels and frozen bits may be mapped to the noisy bit channels, and the transmitting device may transmit a codeword in accordance with the mapping to the respective bit channels. In some examples, rate matching may be performed on a codeword, which may include puncturing or shortening some quantity of coded bits of the codeword.

SUMMARY

The systems, methods, and devices of this disclosure each have several innovative aspects, no single one of which is solely responsible for the desirable attributes disclosed herein.

One innovative aspect of the subject matter described in this disclosure can be implemented in a method for wireless communication. The method includes encoding an information bit vector into a set of multiple code blocks using a polar code that is partitioned into a set of multiple sub-blocks having a same block length in accordance with a polar transformation associated with a modulation scheme, each code block of the set of multiple code blocks being encoded using a respective sub-block of the set of multiple sub-blocks, interleaving respective bits of each code block of the set of multiple code blocks using a respective interleaver of a set of multiple interleavers, and transmitting the respective interleaved bits of each code block of the set of multiple code blocks over a respective bit channel of a set of multiple bit channels, each bit channel of the set of multiple bit channels being associated with a respective reliability.

Another innovative aspect of the subject matter described in this disclosure can be implemented in a wireless communication device. The wireless communication device may include a processing system that includes processor circuitry and memory circuitry that stores code. The processing system may be configured to cause the wireless communication device to encode an information bit vector into a set of multiple code blocks using a polar code that is partitioned into a set of multiple sub-blocks having a same block length in accordance with a polar transformation associated with a modulation scheme, each code block of the set of multiple code blocks being encoded using a respective sub-block of the set of multiple sub-blocks, interleave respective bits of each code block of the set of multiple code blocks using a respective interleaver of a set of multiple interleavers, and transmit the respective interleaved bits of each code block of the set of multiple code blocks over a respective bit channel of a set of multiple bit channels, each bit channel of the set of multiple bit channels being associated with a respective reliability.

Another innovative aspect of the subject matter described in this disclosure can be implemented in another wireless communication device. The wireless communication device may include means for encoding an information bit vector into a set of multiple code blocks using a polar code that is partitioned into a set of multiple sub-blocks having a same block length in accordance with a polar transformation associated with a modulation scheme, each code block of the set of multiple code blocks being encoded using a respective sub-block of the set of multiple sub-blocks, means for interleaving respective bits of each code block of the set of multiple code blocks using a respective interleaver of a set of multiple interleavers, and means for transmitting the respective interleaved bits of each code block of the set of multiple code blocks over a respective bit channel of a set of multiple bit channels, each bit channel of the set of multiple bit channels being associated with a respective reliability.

Another innovative aspect of the subject matter described in this disclosure can be implemented in a non-transitory computer-readable medium storing code for wireless communication is described. The code may include instructions executable by one or more processors to encode an information bit vector into a set of multiple code blocks using a polar code that is partitioned into a set of multiple sub-blocks having a same block length in accordance with a polar transformation associated with a modulation scheme, each code block of the set of multiple code blocks being encoded using a respective sub-block of the set of multiple sub-blocks, interleave respective bits of each code block of the set of multiple code blocks using a respective interleaver of a set of multiple interleavers, and transmit the respective interleaved bits of each code block of the set of multiple code blocks over a respective bit channel of a set of multiple bit channels, each bit channel of the set of multiple bit channels being associated with a respective reliability.

In some examples of the method, wireless communication devices, and non-transitory computer-readable medium described herein, encoding the information bit vector may include operations, features, means, or instructions for mapping bits of the information bit vector to respective bit locations associated with the set of multiple sub-blocks, where the bits of each code block may be interleaved in accordance with the respective bit locations.

In some examples of the method, wireless communication devices, and non-transitory computer-readable medium described herein, encoding the information bit vector may include operations, features, means, or instructions for allocating a respective quantity of bits of the information bit vector to each sub-block of the set of multiple sub-blocks in accordance with reliabilities respectively associated with the bits of the information bit vector and determining a bit position for each bit of the respective quantity of bits allocated to each sub-block of the set of multiple sub-blocks, where each code block of the set of multiple code blocks includes the respective quantity of bits of the information bit vector in accordance with the bit positions.

In some examples of the method, wireless communication devices, and non-transitory computer-readable medium described herein, allocating the quantities of bits of the information bit vector to the set of multiple sub-blocks may include operations, features, means, or instructions for determining single-bit reliabilities of respective bit channel sub-blocks for each sub-block of the set of multiple sub-blocks, selecting respective subsets of the respective bit channel sub-blocks for each sub-block of the set of multiple sub-blocks in accordance with the single-bit reliabilities, and dividing respective sets of bits into partitions allocated to the respective subsets of the respective bit channel sub-blocks for each sub-block of the set of multiple sub-blocks in accordance with the single-bit reliabilities.

In some examples of the method, wireless communication devices, and non-transitory computer-readable medium described herein, determining the bit position for each bit of the respective quantity of bits may include operations, features, means, or instructions for determining the bit position for each bit of the partitions in each bit channel sub-block in accordance with the single-bit reliabilities.

In some examples of the method, wireless communication devices, and non-transitory computer-readable medium described herein, allocating the respective quantity of bits of the information bit vector to each sub-block of the set of multiple sub-blocks may include operations, features, means, or instructions for dividing respective sets of bits into partitions allocated to bit channel sub-blocks for each sub-block of the set of multiple sub-blocks, where the respective sets of bits may be divided in accordance with a mutual information transfer function, and where the respective quantity of bits may be allocated to each sub-block of the set of multiple sub-blocks in accordance with the mutual information transfer function.

In some examples of the method, wireless communication devices, and non-transitory computer-readable medium described herein, the respective sets of bits may be divided into partitions recursively, the recursive dividing may be stopped based on the bit channel sub-blocks being associated with a threshold length, and determining the bit position for each bit of the respective quantity of bits may be based on the bit channel sub-blocks being associated with the threshold length.

In some examples of the method, wireless communication devices, and non-transitory computer-readable medium described herein, each code block may be associated with a respective quantity of encoded bits and the method, apparatuses, and non-transitory computer-readable medium may include further operations, features, means, or instructions for performing rate matching for the respective quantity of the encoded bits associated with each code block in accordance with the same block length of each sub-block.

In some examples of the method, wireless communication devices, and non-transitory computer-readable medium described herein, performing the rate matching for the respective quantity of the encoded bits may include operations, features, means, or instructions for shortening a subset of the respective quantity of the encoded bits associated with each code block, the subset including a first quantity of the encoded bits at an end of the respective quantity of the encoded bits associated with each code block.

In some examples of the method, wireless communication devices, and non-transitory computer-readable medium described herein, performing the rate matching for the respective quantity of the encoded bits may include operations, features, means, or instructions for puncturing a subset of the respective quantity of the encoded bits associated with each code block, the subset including a first quantity of the encoded bits at a beginning of the respective quantity of the encoded bits associated with each code block.

Details of one or more implementations of the subject matter described in this disclosure are set forth in the accompanying drawings and the description below. Other features, aspects, and advantages will become apparent from the description, the drawings and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figure 1:
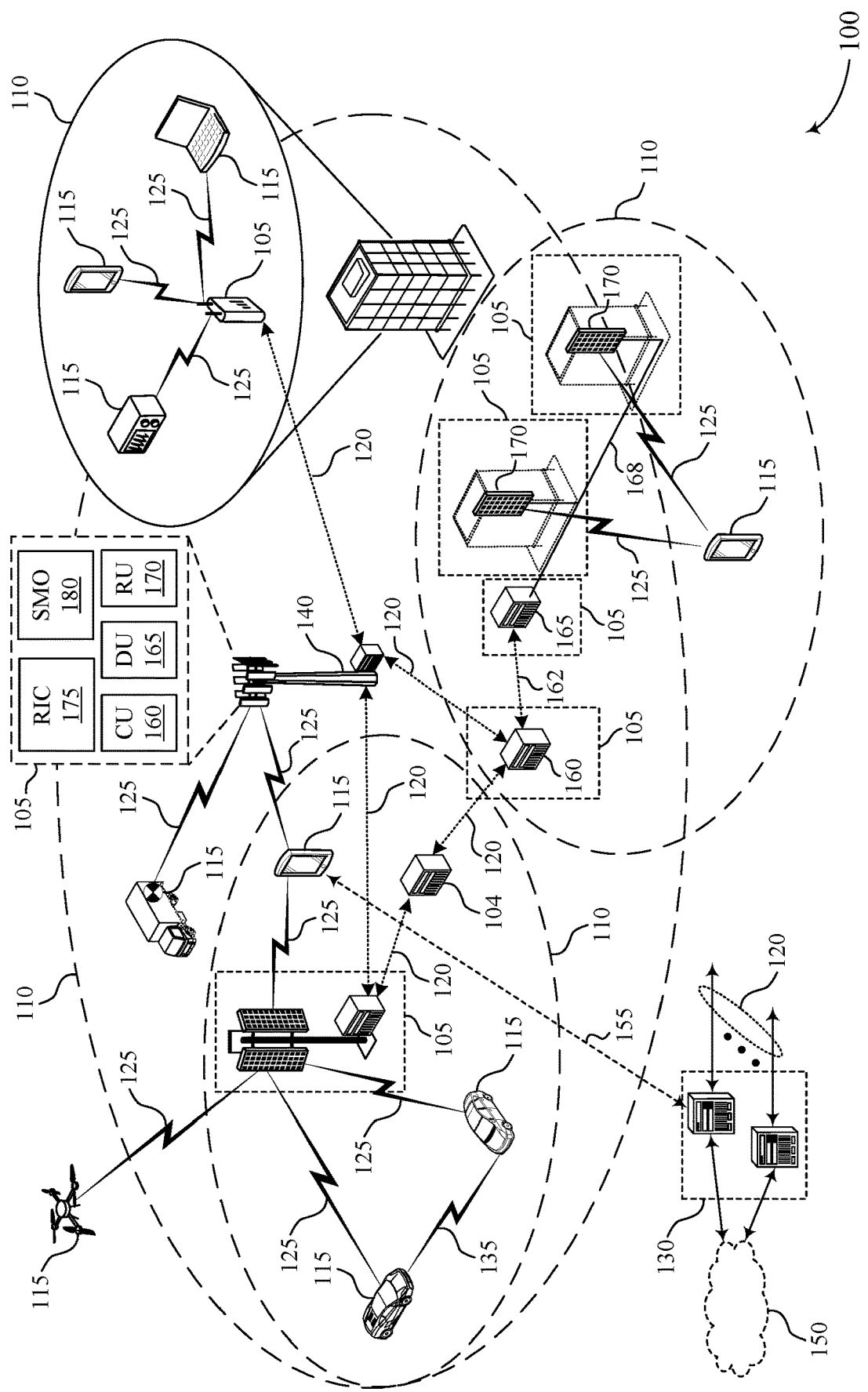
FIG. 1 shows a pictorial diagram of an example wireless communications system.

The following description is directed to some implementations for the purposes of describing the innovative aspects of this disclosure. However, a person having ordinary skill in the art will readily recognize that the teachings herein can be applied in a multitude of different ways. The described implementations may be implemented in any device, system, or network that is capable of transmitting and receiving radio frequency (RF) signals according to any of the Institute of Electrical and Electronics Engineers (IEEE) 16.11 standards, or any of the IEEE 802.11 standards, the Bluetooth® standard, code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A. EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless, cellular or internet of things (IOT) network, such as a system utilizing third generation (3G), fourth generation (4G), fifth generation (5G), or sixth generation (6G), or further implementations thereof, technology.

Some wireless communications systems may support the use of polar codes for wireless communications. Polar coding involves assigning information bits to different bit channels and encoding the bits such that some bit channels are associated with relatively increased reliability and other bit channels are associated with relatively decreased reliability (such that respective bit channels may be polarized). As an example, an encoder of a transmitting wireless communication device (such as a user equipment (UE) or a network entity) may implement a polar code using a matrix that polarizes copies of a channel into subchannels (which may be referred to as bit channels) that are either relatively noisy (corresponding to decreased reliability) or relatively noiseless (corresponding to increased reliability). Information bits may be mapped to the relatively noiseless bit channels, and frozen bits (for example, bits that may be known by both the transmitting wireless communication device and a receiving wireless communication device) may be mapped to the relatively noisy bit channels. The transmitting wireless communication device may transmit a codeword in accordance with the mapping to the respective bit channels. In some cases, a block length of the polar code may be associated with subchannel reliabilities that may be optimal for some modulation schemes (such as quadrature phase shift keying (QPSK) modulation schemes) but not others. For example, bits of some relatively higher-order modulation scheme symbols (such as quadrature amplitude modulation (QAM) symbols) may be associated with different reliabilities, and some polar coding techniques may not consider these bit reliabilities when information bits are encoded. For instance, some polar coding techniques may average bit reliabilities, which may ignore the reliabilities of the bits in, for example, QAM symbols.

Various aspects generally relate to polar coding techniques for higher-order modulation schemes, and more specifically, to techniques that use different bit reliability levels for symbols of higher-order modulation schemes (such as QAM and others) in which a polar code is partitioned (for example, divided) into multiple sub-blocks that each have a similar structure. In some examples, a transmitting wireless communication device may apply a polar transform (for example, using a polar transformation matrix) to a polar code of block length N that partitions the polar code into the multiple sub-blocks that have a same block length (for example, a block length of N/4 for a 256 QAM scheme). Partitioning the polar code into the respective sub-block may be in accordance with an order of a modulation scheme, and the respective sub-blocks may each correspond to a different bit channel having a corresponding reliability. The transmitting device may assign information bits of an information bit vector to bit channels using the multiple sub-blocks, resulting in respective code blocks. The respective code blocks may correspond to different bit locations (such as a most significant bit, a least significant bit, and others), and the transmitting device may independently interleave bits of each code block with a respective bit-interleaver to obtain a codeword for transmission over the bit channels. In some aspects, rate matching techniques, such as shortening and puncturing, may be used for the codewords generated using the multiple sub-blocks of the partitioned polar code.

Particular aspects of the subject matter described in the disclosure may be implemented to realize one or more of the following advantages. The techniques employed by the described wireless communication devices, such as the transmitting wireless communication device and the receiving wireless communication device, may provide benefits and enhancements to the operation of the wireless communication devices, including efficient encoding and decoding, providing reduced latency and power consumption. For example, operations performed by the described communication devices may provide improvements to polar coding procedures by utilizing different bit reliability levels of QAM symbols, and polar coding performed on such symbols may take advantage of such reliability levels to enhance a code design (for example, by providing improved polarization due to bit grouping). In such examples, the operations performed by the described wireless communication devices using different bit reliability levels of QAM symbols may improve the reliability of transmissions encoded using polar codes.

FIG. 1 shows a pictorial diagram of an example wireless communications system 100. The wireless communications system 100 may include one or more network entities 105, one or more UEs 115, and a core network 130. In some examples, the wireless communications system 100 may be a Long Term Evolution (LTE) network, an LTE-Advanced (LTE-A) network, an LTE-A Pro network, a New Radio (NR) network, or a network operating in accordance with other systems and radio technologies, including future systems and radio technologies not explicitly mentioned herein.

The network entities 105 may be dispersed throughout a geographic area to form the wireless communications system 100 and may include devices in different forms or having different capabilities. In various examples, a network entity 105 may be referred to as a network element, a mobility element, a radio access network (RAN) node, or network equipment, among other nomenclature. In some examples, network entities 105 and UEs 115 may wirelessly communicate via one or more communication links 125 (such as a radio frequency (RF) access link). For example, a network entity 105 may support a coverage area 110 (such as a geographic coverage area) over which the UEs 115 and the network entity 105 may establish one or more communication links 125. The coverage area 110 may be an example of a geographic area over which a network entity 105 and a UE 115 may support the communication of signals according to one or more radio access technologies (RATs).

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be capable of supporting communications with various types of devices, such as other UEs 115 or network entities 105, as shown in FIG. 1.

As described herein, a node of the wireless communications system 100, which may be referred to as a network node, or a wireless node, may be a network entity 105 (such as any network entity described herein), a UE 115 (such as any UE described herein), a network controller, an apparatus, a device, a computing system, one or more components, or another suitable processing entity configured to perform any of the techniques described herein. For example, a node may be a UE 115. As another example, a node may be a network entity 105. As another example, a first node may be configured to communicate with a second node or a third node. In one aspect of this example, the first node may be a UE 115, the second node may be a network entity 105, and the third node may be a UE 115. In another aspect of this example, the first node may be a UE 115, the second node may be a network entity 105, and the third node may be a network entity 105. In yet other aspects of this example, the first, second, and third nodes may be different relative to these examples. Similarly, reference to a UE 115, network entity 105, apparatus, device, computing system, among other examples, may include disclosure of the UE 115, network entity 105, apparatus, device, computing system, among other examples, being a node. For example, disclosure that a UE 115 is configured to receive information from a network entity 105 also discloses that a first node is configured to receive information from a second node.

In some examples, network entities 105 may communicate with the core network 130, or with one another, or both. For example, network entities 105 may communicate with the core network 130 via one or more backhaul communication links 120 (such as in accordance with an S1, N2, N3, or other interface protocol). In some examples, network entities 105 may communicate with one another via a backhaul communication link 120 (such as in accordance with an X2, Xn, or other interface protocol) either directly (such as directly between network entities 105) or indirectly (such as via a core network 130). In some examples, network entities 105 may communicate with one another via a midhaul communication link 162 (such as in accordance with a midhaul interface protocol) or a fronthaul communication link 168 (such as in accordance with a fronthaul interface protocol), or any combination thereof. The backhaul communication links 120, midhaul communication links 162, or fronthaul communication links 168 may be or include one or more wired links (such as an electrical link, an optical fiber link), one or more wireless links (such as a radio link, a wireless optical link), among other examples or various combinations thereof. A UE 115 may communicate with the core network 130 via a communication link 155.

One or more of the network entities 105 described herein may include or may be referred to as a base station (BS) 140 (such as a base transceiver station, a radio BS, an NR BS, an access point, a radio transceiver, a NodeB, an eNodeB (eNB), a next-generation NodeB or a giga-NodeB (either of which may be referred to as a gNB), a 5G NB, a next-generation eNB (ng-eNB), a Home NodeB, a Home eNodeB, or other suitable terminology). In some examples, a network entity 105 (such as a BS 140) may be implemented in an aggregated (such as monolithic, standalone) BS architecture, which may be configured to utilize a protocol stack that is physically or logically integrated within a single network entity 105 (such as a single RAN node, such as a BS 140).

In some examples, a network entity 105 may be implemented in a disaggregated architecture (such as a disaggregated BS architecture, a disaggregated RAN architecture), which may be configured to utilize a protocol stack that is physically or logically distributed among two or more network entities 105, such as an integrated access backhaul (IAB) network, an open RAN (O-RAN) (such as a network configuration sponsored by the O-RAN Alliance), or a virtualized RAN (vRAN) (such as a cloud RAN (C-RAN)). For example, a network entity 105 may include one or more of a central unit (CU) 160, a distributed unit (DU) 165, a radio unit (RU) 170, a RAN Intelligent Controller (RIC) 175 (such as a Near-Real Time RIC (Near-RT RIC), a Non-Real Time RIC (Non-RT RIC)), a Service Management and Orchestration (SMO) 180 system, or any combination thereof. An RU 170 also may be referred to as a radio head, a smart radio head, a remote radio head (RRH), a remote radio unit (RRU), or a transmission reception point (TRP). One or more components of the network entities 105 in a disaggregated RAN architecture may be co-located, or one or more components of the network entities 105 may be located in distributed locations (such as separate physical locations). In some examples, one or more network entities 105 of a disaggregated RAN architecture may be implemented as virtual units (such as a virtual CU (VCU), a virtual DU (VDU), a virtual RU (VRU)).

The split of functionality between a CU 160, a DU 165, and an RU 170 is flexible and may support different functionalities depending on which functions (such as network layer functions, protocol layer functions, baseband functions, RF functions, and any combinations thereof) are performed at a CU 160, a DU 165, or an RU 170. For example, a functional split of a protocol stack may be employed between a CU 160 and a DU 165 such that the CU 160 may support one or more layers of the protocol stack and the DU 165 may support one or more different layers of the protocol stack. In some examples, the CU 160 may host upper protocol layer (such as layer 3 (L3), layer 2 (L2)) functionality and signaling (such as Radio Resource Control (RRC), service data adaption protocol (SDAP), Packet Data Convergence Protocol (PDCP)). The CU 160 may be connected to one or more DUs 165 or RUs 170, and the one or more DUs 165 or RUs 170 may host lower protocol layers, such as layer 1 (L1) (such as physical (PHY) layer) or L2 (such as radio link control (RLC) layer, medium access control (MAC) layer) functionality and signaling, and may each be at least partially controlled by the CU 160. Additionally, or alternatively, a functional split of the protocol stack may be employed between a DU 165 and an RU 170 such that the DU 165 may support one or more layers of the protocol stack and the RU 170 may support one or more different layers of the protocol stack. The DU 165 may support one or multiple different cells (such as via one or more RUs 170). In some examples, a functional split between a CU 160 and a DU 165, or between a DU 165 and an RU 170 may be within a protocol layer (such as some functions for a protocol layer may be performed by one of a CU 160, a DU 165, or an RU 170, while other functions of the protocol layer are performed by a different one of the CU 160, the DU 165, or the RU 170). A CU 160 may be functionally split further into CU control plane (CU-CP) and CU user plane (CU-UP) functions. A CU 160 may be connected to one or more DUs 165 via a midhaul communication link 162 (such as F1, F1-c, F1-u), and a DU 165 may be connected to one or more RUs 170 via a fronthaul communication link 168 (such as open fronthaul (FH) interface). In some examples, a midhaul communication link 162 or a fronthaul communication link 168 may be implemented in accordance with an interface (such as a channel) between layers of a protocol stack supported by respective network entities 105 that are in communication via such communication links.

In wireless communications systems (such as wireless communications system 100), infrastructure and spectral resources for radio access may support wireless backhaul link capabilities to supplement wired backhaul connections, providing an IAB network architecture (such as to a core network 130). In some examples, in an IAB network, one or more network entities 105 (such as IAB nodes 104) may be partially controlled by each other. One or more IAB nodes 104 may be referred to as a donor entity or an IAB donor. One or more DUs 165 or one or more RUs 170 may be partially controlled by one or more CUs 160 associated with a donor network entity 105 (such as a donor BS 140). The one or more donor network entities 105 (such as IAB donors) may be in communication with one or more additional network entities 105 (such as IAB nodes 104) via supported access and backhaul links (such as backhaul communication links 120). IAB nodes 104 may include an IAB mobile termination (IAB-MT) controlled (such as scheduled) by DUs 165 of a coupled IAB donor. An IAB-MT may include an independent set of antennas for relay of communications with UEs 115, or may share the same antennas (such as of an RU 170) of an IAB node 104 used for access via the DU 165 of the IAB node 104 (such as referred to as virtual IAB-MT (vIAB-MT)). In some examples, the IAB nodes 104 may include DUs 165 that support communication links with additional entities (such as IAB nodes 104, UEs 115) within the relay chain or configuration of the access network (such as downstream). In such examples, one or more components of the disaggregated RAN architecture (such as one or more IAB nodes 104 or components of IAB nodes 104) may be configured to operate according to the techniques described herein.

In the examples of the techniques described herein applied in the context of a disaggregated RAN architecture, one or more components of the disaggregated RAN architecture may be configured to support polar coding techniques for higher-order modulation schemes as described herein. For example, some operations described as being performed by a UE 115 or a network entity 105 (such as a BS 140) may additionally, or alternatively, be performed by one or more components of the disaggregated RAN architecture (such as IAB nodes 104, DUs 165, CUs 160, RUs 170, RIC 175, SMO 180).

A UE 115 may include or may be referred to as a mobile device, a wireless device, a wireless communication device, a remote device, a handheld device, or a subscriber device, or some other suitable terminology, where the "device" also may be referred to as a unit, a station, a terminal, or a client, among other examples. A UE 115 also may include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes function as relays as well as the network entities 105 and the network equipment including macro eNBs or gNBs. small cell eNBs or gNBs, or relay BSs, among other examples, as shown in FIG. 1.

The UEs 115 and the network entities 105 may wirelessly communicate with one another via one or more communication links 125 (such as an access link) using resources associated with one or more carriers. The term "carrier" may refer to a set of RF spectrum resources having a defined physical layer structure for supporting the communication links 125. For example, a carrier used for a communication link 125 may include a portion of a RF spectrum band (such as a bandwidth part (BWP)) that is operated according to one or more physical layer channels for a given radio access technology (such as LTE, LTE-A, LTE-A Pro, NR). Each physical layer channel may carry acquisition signaling (such as synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers. Communication between a network entity 105 and other devices may refer to communication between the devices and any portion (such as entity, sub-entity) of a network entity 105. For example, the terms "transmitting," "receiving," or "communicating," when referring to a network entity 105, may refer to any portion of a network entity 105 (such as a BS 140, a CU 160, a DU 165, a RU 170) of a RAN communicating with another device (such as directly or via one or more other network entities 105).

The communication links 125 shown in the wireless communications system 100 may include downlink transmissions (such as forward link transmissions) from a network entity 105 to a UE 115, uplink transmissions (such as return link transmissions) from a UE 115 to a network entity 105, or both, among other configurations of transmissions. Carriers may carry downlink or uplink communications (such as in an FDD mode) or may be configured to carry downlink and uplink communications (such as in a TDD mode).

A carrier may be associated with a particular bandwidth of the RF spectrum and, in some examples, the carrier bandwidth may be referred to as a "system bandwidth" of the carrier or the wireless communications system 100. For example, the carrier bandwidth may be one of a set of bandwidths for carriers of a particular radio access technology (such as 1.4, 3, 5, 10, 15, 20, 40, or 80 megahertz (MHz)). Devices of the wireless communications system 100 (such as the network entities 105, the UEs 115, or both) may have hardware configurations that support communications using a particular carrier bandwidth or may be configurable to support communications using one of a set of carrier bandwidths. In some examples, the wireless communications system 100 may include network entities 105 or UEs 115 that support concurrent communications using carriers associated with multiple carrier bandwidths. In some examples, each served UE 115 may be configured for operating using portions (such as a sub-band, a BWP) or all of a carrier bandwidth.

Signal waveforms transmitted via a carrier may be made up of multiple subcarriers (such as using multi-carrier modulation (MCM) techniques such as orthogonal frequency division multiplexing (OFDM) or discrete Fourier transform spread OFDM (DFT-S-OFDM)). In a system employing MCM techniques, a resource element may refer to resources of one symbol period (such as a duration of one modulation symbol) and one subcarrier, for which the symbol period and subcarrier spacing may be inversely related. The quantity of bits carried by each resource element may depend on the modulation scheme (such as the order of the modulation scheme, the coding rate of the modulation scheme, or both), such that a relatively higher quantity of resource elements (such as in a transmission duration) and a relatively higher order of a modulation scheme may correspond to a relatively higher rate of communication. A wireless communications resource may refer to a combination of an RF spectrum resource, a time resource, and a spatial resource (such as a spatial layer, a beam), and the use of multiple spatial resources may increase the data rate or data integrity for communications with a UE 115.

Modulation is the process of representing a digital signal by modifying the properties of a periodic waveform (such as, frequency, amplitude, and phase). Demodulation takes a modified waveform and generates a digital signal. A modulated waveform may be divided into time units known as symbols. Each symbol may be modulated separately. In a wireless communication system (such as wireless communications system 100) that uses relatively frequency subcarriers to transmit distinct symbols, the modulation may be accomplished by varying the phase and amplitude of each symbol. For example, a binary phase shift keying (BPSK) modulation scheme conveys information by alternating between waveforms that are transmitted with no phase offset or with a 180° offset (that is, each symbol conveys a single bit of information). In a QAM scheme, two carrier signals (known as the in-phase component, I, and the quadrature component, Q) may be transmitted with a phase offset of 90°, and each signal may be transmitted with specific amplitude selected from a finite set. The number of amplitude bins may determine the number of bits that are conveyed by each symbol. For example, in a 16-QAM scheme, each carrier signal may have one of four amplitudes (such as, −3, −1, 1, 3), which results in 16 possible combinations (that is, 4 bits). The various possible combinations may be represented in a graph known as a constellation map, where the amplitude of the I component is represented on the horizontal axis and the Q component is represented on the vertical axis.

One or more numerologies for a carrier may be supported, and a numerology may include a subcarrier spacing ($\Delta f$) and a cyclic prefix. A carrier may be divided into one or more BWPs having the same or different numerologies. In some examples, a UE 115 may be configured with multiple BWPs. In some examples, a single BWP for a carrier may be active at a given time and communications for the UE 115 may be restricted to one or more active BWPs.

The time intervals for the network entities 105 or the UEs 115 may be expressed in multiples of a basic time unit which may, in some examples, refer to a sampling period of $T_s = 1/(\Delta f_{max} \cdot N_f)$ seconds, for which $\Delta f_{max}$ may represent a supported subcarrier spacing, and $N_f$ may represent a supported discrete Fourier transform (DFT) size. Time intervals of a communications resource may be organized according to radio frames each having a specified duration (such as 10 milliseconds (ms)). Each radio frame may be identified by a system frame number (SFN) (such as ranging from 0 to 1023).

Each frame may include multiple consecutively numbered subframes or slots, and each subframe or slot may have the same duration. In some examples, a frame may be divided (such as in the time domain) into subframes, and each subframe may be further divided into a quantity of slots. Alternatively, each frame may include a variable quantity of slots, and the quantity of slots may depend on subcarrier spacing. Each slot may include a quantity of symbol periods (such as depending on the length of the cyclic prefix prepended to each symbol period). In some wireless communications systems 100, a slot may further be divided into multiple mini-slots associated with one or more symbols. Excluding the cyclic prefix, each symbol period may be associated with one or more (such as $N_f$) sampling periods. The duration of a symbol period may depend on the subcarrier spacing or frequency band of operation.

A subframe, a slot, a mini-slot, or a symbol may be the smallest scheduling unit (such as in the time domain) of the wireless communications system 100 and may be referred to as a transmission time interval (TTI). In some examples, the TTI duration (such as a quantity of symbol periods in a TTI) may be variable. Additionally, or alternatively, the smallest scheduling unit of the wireless communications system 100 may be dynamically selected (such as in bursts of shortened TTIs (STTIs)).

Physical channels may be multiplexed for communication using a carrier according to various techniques. A physical control channel and a physical data channel may be multiplexed for signaling via a downlink carrier, for example, using one or more of time division multiplexing (TDM) techniques, frequency division multiplexing (FDM) techniques, or hybrid TDM-FDM techniques. A control region (such as a control resource set (CORESET)) for a physical control channel may be defined by a set of symbol periods and may extend across the system bandwidth or a subset of the system bandwidth of the carrier. One or more control regions (such as CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to an amount of control channel resources (such as control channel elements (CCEs)) associated with encoded information for a control information format having a given payload size. Search space sets may include common search space sets configured for sending control information to multiple UEs 115 and UE-specific search space sets for sending control information to a specific UE 115.

A network entity 105 may provide communication coverage via one or more cells, for example a macro cell, a small cell, a hot spot, or other types of cells, or any combination thereof. The term "cell" may refer to a logical communication entity used for communication with a network entity 105 (such as using a carrier) and may be associated with an identifier for distinguishing neighboring cells (such as a physical cell identifier (PCID), a virtual cell identifier (VCID), or others). In some examples, a cell also may refer to a coverage area 110 or a portion of a coverage area 110 (such as a sector) over which the logical communication entity operates. Such cells may range from smaller areas (such as a structure, a subset of structure) to larger areas depending on various factors such as the capabilities of the network entity 105. For example, a cell may be or include a building, a subset of a building, or exterior spaces between or overlapping with coverage areas 110, among other examples.

A macro cell generally covers a relatively large geographic area (such as several kilometers in radius) and may allow unrestricted access by the UEs 115 with service subscriptions with the network provider supporting the macro cell. A small cell may be associated with a lower-powered network entity 105 (such as a lower-powered BS 140), as compared with a macro cell, and a small cell may operate using the same or different (such as licensed, unlicensed) frequency bands as macro cells. Small cells may provide unrestricted access to the UEs 115 with service subscriptions with the network provider or may provide restricted access to the UEs 115 having an association with the small cell (such as the UEs 115 in a closed subscriber group (CSG), the UEs 115 associated with users in a home or office). A network entity 105 may support one or multiple cells and also may support communications via the one or more cells using one or multiple component carriers.

In some examples, a carrier may support multiple cells, and different cells may be configured according to different protocol types (such as MTC, narrowband IoT (NB-IoT), enhanced mobile broadband (eMBB)) that may provide access for different types of devices.

In some examples, a network entity 105 (such as a BS 140, an RU 170) may be movable and provide communication coverage for a moving coverage area 110. In some examples, different coverage areas 110 associated with different technologies may overlap, but the different coverage areas 110 may be supported by the same network entity 105. In some other examples, the overlapping coverage areas 110 associated with different technologies may be supported by different network entities 105. The wireless communications system 100 may include, for example, a heterogeneous network in which different types of the network entities 105 provide coverage for various coverage areas 110 using the same or different radio access technologies.

Some UEs 115, such as MTC or IoT devices, may be low cost or low complexity devices and may provide for automated communication between machines (such as via Machine-to-Machine (M2M) communication). M2M communication or MTC may refer to data communication technologies that allow devices to communicate with one another or a network entity 105 (such as a BS 140) without human intervention. In some examples, M2M communication or MTC may include communications from devices that integrate sensors or meters to measure or capture information and relay such information to a central server or application program that uses the information or presents the information to humans interacting with the application program. Some UEs 115 may be designed to collect information or enable automated behavior of machines or other devices. Examples of applications for MTC devices include smart metering, inventory monitoring, water level monitoring, equipment monitoring, healthcare monitoring, wildlife monitoring, weather and geological event monitoring. fleet management and tracking, remote security sensing, physical access control, and transaction-based business charging.

Some UEs 115 may be configured to employ operating modes that reduce power consumption, such as half-duplex communications (such as a mode that supports one-way communication via transmission or reception, but not transmission and reception concurrently). In some examples, half-duplex communications may be performed at a reduced peak rate. Other power conservation techniques for the UEs 115 include entering a power saving deep sleep mode when not engaging in active communications, operating using a limited bandwidth (such as according to narrowband communications), or a combination of these techniques. For example, some UEs 115 may be configured for operation using a narrowband protocol type that is associated with a defined portion or range (such as set of subcarriers or resource blocks (RBs)) within a carrier, within a guard-band of a carrier, or outside of a carrier.

The wireless communications system 100 may be configured to support ultra-reliable communications or low-latency communications, or various combinations thereof. For example, the wireless communications system 100 may be configured to support ultra-reliable low-latency communications (URLLC). The UEs 115 may be designed to support ultra-reliable, low-latency, or critical functions. Ultra-reliable communications may include private communication or group communication and may be supported by one or more services such as push-to-talk, video, or data. Support for ultra-reliable, low-latency functions may include prioritization of services, and such services may be used for public safety or general commercial applications. The terms ultra-reliable, low-latency, and ultra-reliable low-latency may be used interchangeably herein.

In some examples, a UE 115 may be configured to support communicating directly with other UEs 115 via a device-to-device (D2D) communication link 135 (such as in accordance with a peer-to-peer (P2P), D2D, or sidelink protocol). In some examples, one or more UEs 115 of a group that are performing D2D communications may be within the coverage area 110 of a network entity 105 (such as a BS 140, an RU 170), which may support aspects of such D2D communications being configured by (such as scheduled by) the network entity 105. In some examples, one or more UEs 115 of such a group may be outside the coverage area 110 of a network entity 105 or may be otherwise unable to or not configured to receive transmissions from a network entity 105. In some examples, groups of the UEs 115 communicating via D2D communications may support a one-to-many (1:M) system in which each UE 115 transmits to each of the other UEs 115 in the group. In some examples, a network entity 105 may facilitate the scheduling of resources for D2D communications. In some other examples, D2D communications may be carried out between the UEs 115 without an involvement of a network entity 105.

In some systems, a D2D communication link 135 may be an example of a communication channel, such as a sidelink communication channel, between vehicles (such as UEs 115). In some examples, vehicles may communicate using vehicle-to-everything (V2X) communications, vehicle-to-vehicle (V2V) communications, or some combination of these. A vehicle may signal information related to traffic conditions, signal scheduling, weather, safety, emergencies, or any other information relevant to a V2X system. In some examples, vehicles in a V2X system may communicate with roadside infrastructure, such as roadside units, or with the network via one or more network nodes (such as network entities 105, BSs 140, RUs 170) using vehicle-to-network (V2N) communications, or with both.

The core network 130 may provide user authentication, access authorization, tracking. Internet Protocol (IP) connectivity, and other access, routing, or mobility functions. The core network 130 may be an evolved packet core (EPC) or 5G core (5GC), which may include at least one control plane entity that manages access and mobility (such as a mobility management entity (MME), an access and mobility management function (AMF)) and at least one user plane entity that routes packets or interconnects to external networks (such as a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the network entities 105 (such as BSs 140) associated with the core network 130. User IP packets may be transferred through the user plane entity, which may provide IP address allocation as well as other functions. The user plane entity may be connected to IP services 150 for one or more network operators. The IP services 150 may include access to the Internet, Intranet(s), an IP Multimedia Subsystem (IMS), or a Packet-Switched Streaming Service.

The wireless communications system 100 may operate using one or more frequency bands, which may be in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. UHF waves may be blocked or redirected by buildings and environmental features, which may be referred to as clusters, but the waves may penetrate structures sufficiently for a macro cell to provide service to the UEs 115 located indoors. Communication using UHF waves may be associated with smaller antennas and shorter ranges (such as less than 100 kilometers) compared to communications using the smaller frequencies and longer waves of the high frequency (HF) or very high frequency (VHF) portion of the spectrum below 300 MHz.

The wireless communications system 100 also may operate using a super high frequency (SHF) region, which may be in the range of 3 GHz to 30 GHz, also known as the centimeter band, or using an extremely high frequency (EHF) region of the spectrum (such as from 30 GHz to 300 GHz), also known as the millimeter band. In some examples, the wireless communications system 100 may support millimeter wave (mmW) communications between the UEs 115 and the network entities 105 (such as BSs 140, RUs 170), and EHF antennas of the respective devices may be smaller and more closely spaced than UHF antennas. In some examples, such techniques may facilitate using antenna arrays within a device. The propagation of EHF transmissions, however, may be subject to even greater attenuation and shorter range than SHF or UHF transmissions. The techniques disclosed herein may be employed across transmissions that use one or more different frequency regions, and designated use of bands across these frequency regions may differ by country or regulating body.

The wireless communications system 100 may utilize both licensed and unlicensed RF spectrum bands. For example, the wireless communications system 100 may employ License Assisted Access (LAA), LTE-Unlicensed (LTE-U) radio access technology, or NR technology using an unlicensed band such as the 5 GHz industrial, scientific, and medical (ISM) band. While operating using unlicensed RF spectrum bands, devices such as the network entities 105 and the UEs 115 may employ carrier sensing for collision detection and avoidance. In some examples, operations using unlicensed bands may be in accordance with a carrier aggregation configuration in conjunction with component carriers operating using a licensed band (such as LAA). Operations using unlicensed spectrum may include downlink transmissions, uplink transmissions, P2P transmissions, or D2D transmissions, among other examples.

A network entity 105 (such as a BS 140, an RU 170) or a UE 115 may be equipped with multiple antennas, which may be used to employ techniques such as transmit diversity, receive diversity, multiple-input multiple-output (MIMO) communications, or beamforming. The antennas of a network entity 105 or a UE 115 may be located within one or more antenna arrays or antenna panels, which may support MIMO operations or transmit or receive beamforming. For example, one or more BS antennas or antenna arrays may be co-located at an antenna assembly, such as an antenna tower. In some examples, antennas or antenna arrays associated with a network entity 105 may be located at diverse geographic locations. A network entity 105 may include an antenna array with a set of rows and columns of antenna ports that the network entity 105 may use to support beamforming of communications with a UE 115. Likewise, a UE 115 may include one or more antenna arrays that may support various MIMO or beamforming operations. Additionally, or alternatively, an antenna panel may support RF beamforming for a signal transmitted via an antenna port.

The network entities 105 or the UEs 115 may use MIMO communications to exploit multipath signal propagation and increase spectral efficiency by transmitting or receiving multiple signals via different spatial layers. Such techniques may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream and may carry information associated with the same data stream (such as the same codeword) or different data streams (such as different codewords). Different spatial layers may be associated with different antenna ports used for channel measurement and reporting. MIMO techniques include single-user MIMO (SU-MIMO), for which multiple spatial layers are transmitted to the same receiving device, and multiple-user MIMO (MU-MIMO), for which multiple spatial layers are transmitted to multiple devices.

Beamforming, which also may be referred to as spatial filtering, directional transmission, or directional reception, is a signal processing technique that may be used at a transmitting device or a receiving device (such as a network entity 105, a UE 115) to shape or steer an antenna beam (such as a transmit beam, a receive beam) along a spatial path between the transmitting device and the receiving device. Beamforming may be achieved by combining the signals communicated via antenna elements of an antenna array such that some signals propagating along particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (such as with respect to the antenna array of the transmitting device or receiving device, or with respect to some other orientation).

A network entity 105 or a UE 115 may use beam sweeping techniques as part of beamforming operations. For example, a network entity 105 (such as a BS 140, an RU 170) may use multiple antennas or antenna arrays (such as antenna panels) to conduct beamforming operations for directional communications with a UE 115. Some signals (such as synchronization signals, reference signals, beam selection signals, or other control signals) may be transmitted by a network entity 105 multiple times along different directions. For example, the network entity 105 may transmit a signal according to different beamforming weight sets associated with different directions of transmission. Transmissions along different beam directions may be used to identify (such as by a transmitting device, such as a network entity 105, or by a receiving device, such as a UE 115) a beam direction for later transmission or reception by the network entity 105.

Some signals, such as data signals associated with a particular receiving device, may be transmitted by transmitting device (such as a transmitting network entity 105, a transmitting UE 115) along a single beam direction (such as a direction associated with the receiving device, such as a receiving network entity 105 or a receiving UE 115). In some examples, the beam direction associated with transmissions along a single beam direction may be determined according to a signal that was transmitted along one or more beam directions. For example, a UE 115 may receive one or more of the signals transmitted by the network entity 105 along different directions and may report to the network entity 105 an indication of the signal that the UE 115 received with a highest signal quality or an otherwise acceptable signal quality.

In some examples, transmissions by a device (such as by a network entity 105 or a UE 115) may be performed using multiple beam directions, and the device may use a combination of digital precoding or beamforming to generate a combined beam for transmission (such as from a network entity 105 to a UE 115). The UE 115 may report feedback that indicates precoding weights for one or more beam directions, and the feedback may correspond to a configured set of beams across a system bandwidth or one or more sub-bands. The network entity 105 may transmit a reference signal (such as a cell-specific reference signal (CRS), a channel state information reference signal (CSI-RS)), which may be precoded or unprecoded. The UE 115 may provide feedback for beam selection, which may be a precoding matrix indicator (PMI) or codebook-based feedback (such as a multi-panel type codebook, a linear combination type codebook, a port selection type codebook). Although these techniques are described with reference to signals transmitted along one or more directions by a network entity 105 (such as a BS 140, an RU 170), a UE 115 may employ similar techniques for transmitting signals multiple times along different directions (such as for identifying a beam direction for subsequent transmission or reception by the UE 115) or for transmitting a signal along a single direction (such as for transmitting data to a receiving device).

A receiving device (such as a UE 115) may perform reception operations in accordance with multiple receive configurations (such as directional listening) when receiving various signals from a transmitting device (such as a network entity 105), such as synchronization signals, reference signals, beam selection signals, or other control signals. For example, a receiving device may perform reception in accordance with multiple receive directions by receiving via different antenna subarrays, by processing received signals according to different antenna subarrays, by receiving according to different receive beamforming weight sets (such as different directional listening weight sets) applied to signals received at multiple antenna elements of an antenna array, or by processing received signals according to different receive beamforming weight sets applied to signals received at multiple antenna elements of an antenna array, any of which may be referred to as "listening" according to different receive configurations or receive directions. In some examples, a receiving device may use a single receive configuration to receive along a single beam direction (such as when receiving a data signal). The single receive configuration may be aligned along a beam direction determined in accordance with listening according to different receive configuration directions (such as a beam direction determined to have a highest signal strength, highest signal-to-noise ratio (SNR), or otherwise acceptable signal quality in accordance with listening according to multiple beam directions).

The UEs 115 and the network entities 105 may support retransmissions of data to increase the likelihood that data is received successfully. Hybrid automatic repeat request (HARQ) feedback is one technique for increasing the likelihood that data is received correctly via a communication link (such as a communication link 125, a D2D communication link 135). HARQ may include a combination of error detection (such as using a cyclic redundancy check (CRC)), forward error correction (FEC), and retransmission (such as automatic repeat request (ARQ)). HARQ may improve throughput at the MAC layer in poor radio conditions (such as low signal-to-noise conditions). In some examples, a device may support same-slot HARQ feedback, for which the device may provide HARQ feedback in a specific slot for data received via a previous symbol in the slot. In some other examples, the device may provide HARQ feedback in a subsequent slot, or according to some other time interval.

The wireless communications system 100 may support techniques for partitioning a polar code into multiple sub-blocks (such as polar code sub-blocks), such that a transmitting wireless communication device may utilize different reliabilities of respective bits of a modulation symbol when encoding an information bit vector into multiple code blocks. For example, a transmitting wireless communication device, such as a UE 115 or a network entity 105, may apply a polar transform (such as a transformation matrix) to a polar code (for example, a polar code of block length N) to partition the polar code into multiple sub-blocks that have a same block length. The polar code may be partitioned in accordance with a modulation order of a modulation scheme (such as a QAM scheme), a quantity of bit channels, and different reliabilities associated with the bit channels. Further, the transmitting wireless communication device may assign information bits of an information bit vector to the bit channels using the multiple sub-blocks to generate multiple code blocks. The transmitting wireless communication device may interleave each code block with a respective bit-interleaver to obtain a codeword for transmission over the bit channels.

Figure 2:
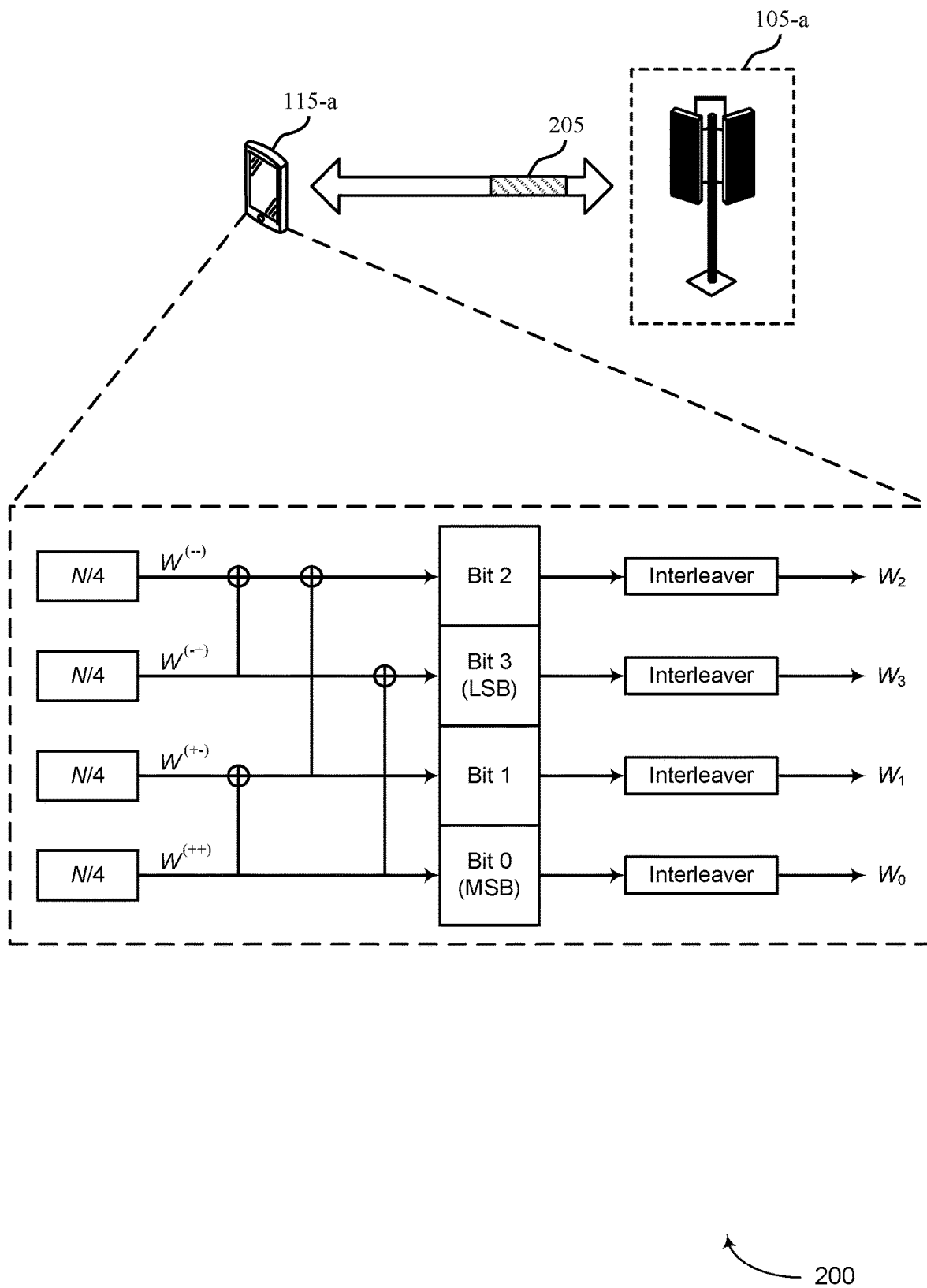
FIG. 2 shows an example of a wireless communications system that supports polar coding techniques for higher-order modulation schemes.

FIG. 2 shows an example of a wireless communications system 200 that supports polar coding techniques for higher-order modulation schemes. In some examples, the wireless communications system 200 may implement or be implemented by aspects of the wireless communications system 100. For example, the wireless communications system 200 may include one or more transmitting wireless communication devices (such as a UE 115-a) and one or more receiving wireless communication devices (such as a network entity 105-a), which may be examples of the corresponding devices as described herein.

The UE 115-a may include a memory, an encoder, and a transmitter. In some examples, the UE 115-a may have data stored in the memory to transmit to another wireless communication device, such as the network entity 105-a. To initiate the transmission process, the UE 115-a may retrieve the data for transmission from the memory. The data may include a quantity of payload bits, 'A,' which may be 1 s or 0 s, provided from the memory to the encoder. In some examples, these payload bits may be combined with a quantity (such as a number) of parity or error checking bits, 'E,' to form a total set of information bits, 'A+E.' The quantity of information bits may be represented as a value 'K,' as shown. The encoder may implement a polar code with a block length, 'N,' for encoding the information bits. In some examples, N may be different than or the same as K. Such a polar code may be referred to as an (N, K) polar code. In some examples, the bits that are not allocated as information bits (such as N–K bits) may be assigned as frozen bits.

In some examples, to perform a polar coding operation, the encoder may generate a codeword of length, 'M.' In some examples, M may be a power of 2 (that is $M=2^m$, where m is an integer value). In some examples, if N is not a power of 2, the encoder may round the value of N up to a nearest valid M value. The encoder may implement an ($N=2^m$, K) polar code according to Equation 1:

$$c = u \begin{pmatrix} 1 & 0 \\ 1 & 1 \end{pmatrix}^{\otimes m} \quad (1)$$

where bits $u_i$ are either information (that is, carrying payload) or frozen (such as $u_i=0$). The matrix $$\begin{pmatrix} 1 & 0 \\ 1 & 1 \end{pmatrix}^{\otimes m}$$

polarizes $2^m$ copies of a channel W into subchannels $W^i$ that are either almost noisy (such as $I(W^i) \to 0$) or almost noiseless (such as $I(W^i) \to 1$). The information bits, $i_0, \ldots i_{K-1}$, may correspond to the K largest capacities $I(W^i)$. For example, if N=400, the encoder may determine a codeword length of M=512 (such as the nearest valid value for M greater than or equal to N) to support polar coding. In these examples, the encoder may encode a codeword of length M, and then may puncture a quantity of bits M–N to obtain a codeword of the specified block length N for transmission.

In some examples, the encoder may use various bit-channel selection techniques to assign the information bits to the K most reliable bit channels, and the frozen bits may be assigned to the remaining bit channels. As an example (such as for large values of M or N, such as M=1024), the encoder may implement a FRActally eNhanced Kernel (FRANK) polar code construction (which may be referred to as a mutual information-based polarization (MIP) scheme) for assigning the information bits K to the most (or an estimation of the most) reliable bit channels. To determine the distribution of information bits between bit channels or channel groups, the encoder may utilize mutual information. Mutual information may be an example of a metric for polarization, and may map rate distributions R for unpolarized channels W to rate distributions R1 and R2 for polarized channels W⁻ and W⁺, respectively. In some examples, an encoder may utilize mutual information (as opposed to reliability metrics) to assign bit channels in accordance with coding rate, R.

To construct a capacity-achieving polar code with successive cancellation (SC) decoding for a channel W with a coding rate $$R = \frac{K}{N},$$

the encoder may distribute the information bits K such that the sub-code also achieve capacity on the polarized channels W⁻ and W⁺. To achieve capacity on channels W⁻ and W⁺ (for example, a polar transformation may take two copies of a channel W, resulting in channels W⁻ and W⁺, while preserving a capacity, I, of the channel W), the encoder may distribute information bits according to Equation 2:

$$K^- = I^- * \left(\frac{N}{2}\right), \text{ and } K^+ = I^+ * \left(\frac{N}{2}\right), \quad (2)$$

where K⁻ is a quantity of information bits to include in the first half of sub-blocks, K⁺ is a quantity of information bits to include in the second half of sub-blocks and $K=K^++K^-$. In some examples, K⁻ may be referred to as $K_{upper}$ and K⁺ may be referred to as $K_{lower}$. Further, I⁻ (such as $I_{awgn}^-$) is a capacity of the channel W⁻ and I⁺ (such as $I_{awgn}^+$) is a capacity of the channel W⁺ and may be calculated according to Equation 3:

$$I_{awgn}^- = 2I - I^2 - \delta, \text{ and } I_{awgn}^+ = I^2 + \delta \quad (3)$$

where I is a capacity of the channel W and δ is calculated according to Equation 4:

$$\delta = -\frac{|I - 0.5|}{32} + \frac{1}{64} \quad (4)$$

where $2I=I^-+I^+$. For FRANK polar code construction with greater than two channels, the encoder may recursively perform these polarizations and information bit assignment procedures. The encoder may stop recursively perform these polarizations and information bit assignment procedures in accordance with the block length, N, satisfying a threshold value (such as until a fixed length for which the encoder may know the information bit positions in accordance with an NR reliability sequence).

In some examples (such as for polar codes), the encoder may round the block length up to the nearest power of 2 to generate M coded bits. N coded bits may be transmitted on N unpunctured bit channels. In some examples, the encoder may perform rate matching for a relatively longer codeword to generate a codeword of a desired length. Rate matching may include puncturing (such as for relatively low target code rates) or shortening (such as for relatively high target code rates). For example, in examples in which the original code block is slightly greater than a power of 2, the encoder may puncture some quantity of coded bits (such as bits at the beginning of the codeword) or shorten some quantity of coded bits (such as bits at the end of the codeword). Here, the encoder may puncture a first quantity of coded bits, equal to N–M, of a set of information bits for relatively low rates or may shorten a last quantity of coded bits, equal to N–M, of the set of information bits for relatively high rates. As an example, if M=1088 and N=2048, then N–M=960 bits that may be punctured or shortened.

FRANK polar code construction may provide improved reliability for generated codewords than some other bit channel selection techniques (such as polarization weight (PW), generator weight (GW)), and in some examples may be relatively less complex than some other polar coding schemes (such as density evolution (DE)). Additionally, FRANK polar code construction may allow the encoder to flexibly adapt the coding rate when generating codewords. The encoder may determine information bit channels in accordance with FRANK polar code construction, and may assign frozen bits to the remaining channels. Frozen bits may be bits of a default value (such as 0 or 1) known to both the encoder and a decoder (such as the encoder that encodes information bits at a transmitter and the decoder that decodes the codeword received at a receiver). Further, the network entity 105-b may receive a data signal representing the codeword via a receiver, and may decode the signal using a decoder to obtain the transmitted data. However, bits of QAM symbols associated with the different bit channels may have different reliabilities, and some techniques may not consider the different reliabilities (that is, some techniques may average the reliabilities).

Techniques described herein may support the consideration of different reliabilities for polar encoding of higher-order modulation schemes (such as QAM and others). That is, a transmitting wireless communication device, such as the UE 115-a, may use multiple bit channels for the transmission of a codeword encoded using a polar code. Each bit channel may be associated with a different reliability (that is, the bit channels may be non-identical channels). For the purposes of this example, a quantity of the multiple bit channels may be 4, such that the bit channels may be represented by $W_0$, $W_1$, $W_2$, and $W_3$. Additionally, the UE 115-a (such as an encoder at the UE 115-a) may apply a polar transform, $A_2$, such as a 4×4 polar transform, to a polar code of total block length N to partition the polar code into multiple sub-blocks. Each sub-block has a same length equal to the total block length divided by the quantity of the bit channels (such as, N/4). The polar transform may be associated with a modulation order, the quantity of the multiple bit channels, and the different reliabilities associated with the multiple bit channels. In other words, partitioning the polar code into the multiple sub-blocks may result in multiple independent polar codes (such as independent code designs for each bit channel), such as 4 independent polar codes with length N/4. The UE 115-a (such as the encoder at the UE 115-a) may implement the sub-blocks (such as polar code sub-blocks), such that each sub-block polarizes a respective bit channel of the multiple bit channels into subchannels (such as $W^{(--)}$, $W^{(-+)}$, $W^{(+-)}$, and $W^{(++)}$). The bit channels may be combined according to a method that results in a relatively fastest polarization (for example, as compared to other bit channel combinations).

Figure 3:
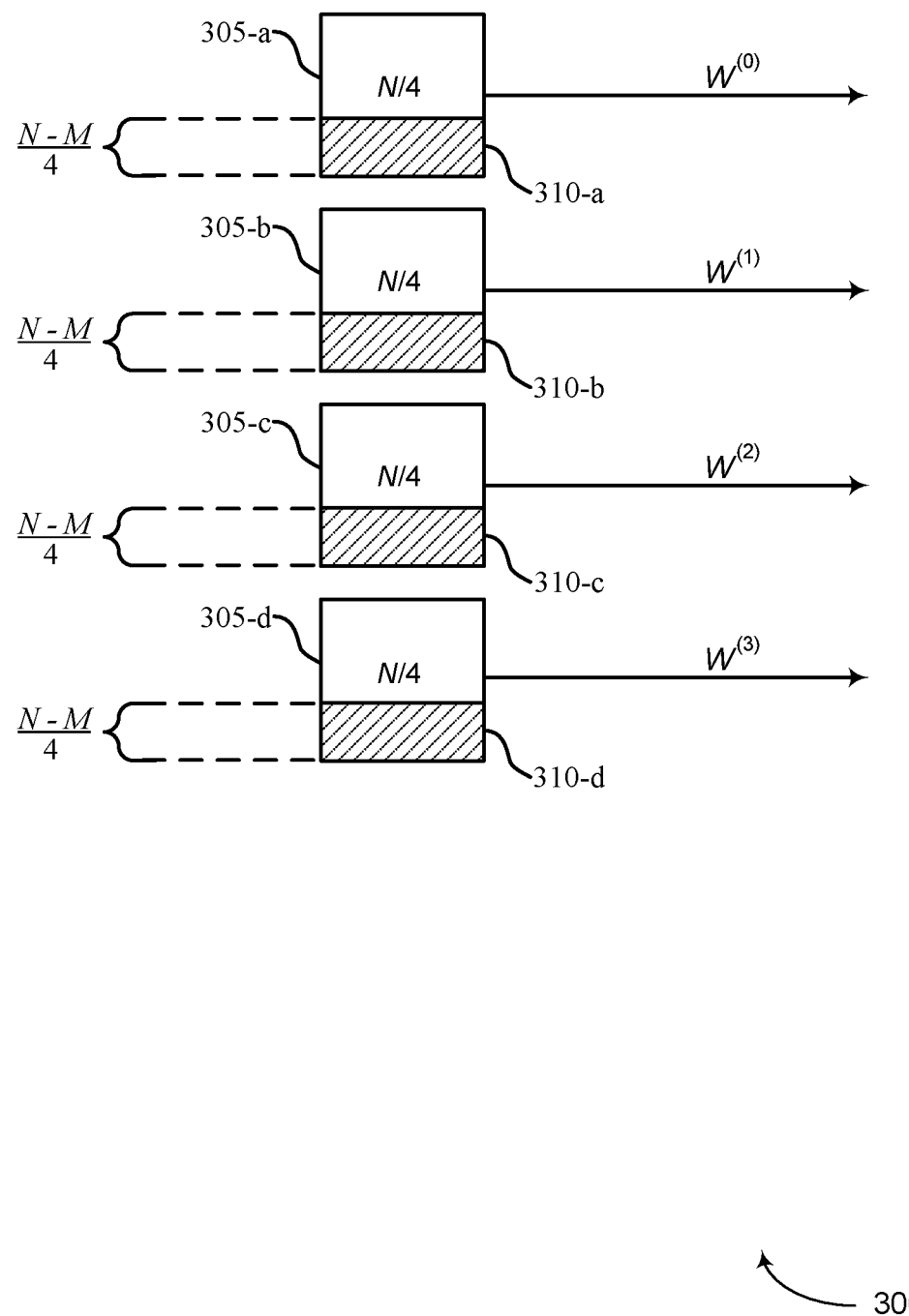
FIGS. 3 and 4 each show examples of rate matching schemes that support polar coding techniques for higher-order modulation schemes.

Additionally, the UE 115-a may assign information bits of an information bit vector to the bit channels using the multiple sub-blocks to generate multiple code blocks, corresponding to bit locations represented by Bit 1, Bit 2, Bit 3, and Bit 4, in FIG. 3. The UE 115-a may identify a quantity of information bits of the information bit vector allocated to each sub-block in accordance with reliabilities respective associated with the quantity of information bits.

In some examples, the UE 115-a may allocate the respective quantities of information bits to each sub-block via implementation of DE (such as DE for QAM (DE-Q)). For each sub-block, the UE 115-a may calculate single-bit reliabilities of bit-channel sub-blocks for a given sub-block and may select a subset of the bit-channel sub-blocks for the given sub-block in accordance with the single-bit reliabilities. For example, the UE 115-a may select K most reliable (for example, the best) bit-channel sub-blocks and may divide a set of information bits allocated to the given sub-block into partitions allocated to the subset of bit-channel sub-blocks for the given sub-block. Further, the UE 115-a may determine information bit positions for each information bit of the set of information bits for the given sub-block based in accordance with the single-bit reliabilities.

Additionally, or alternatively, the UE 115-a may allocate the respective quantities of information bits to each sub-block via implementation of FRANK (such as Finite Block Length (FBL)-MIP for QAM (FBL-MIP-Q)), as described previously. That is, the UE 115-a may determine a rate distribution associated with each bit channel (such as $R^{(--)}$, $R^{(-+)}$, $R^{(+-)}$, and $R^{(++)}$ associated with $W^{(--)}$, $W^{(-+)}$, $W^{(+-)}$, and $W^{(++)}$, respectively) via FBL-FRANK and may implement MIP to recursively determine information bits for each sub-block (such as each N/4 sub-block). In some examples, the UE 115-a may calculate the rate distributions (such as rate adjustments) according to Equation 5:

$$R^{(i)} \approx I^{(i)} - 0.88\left(\frac{N}{4}\right)^{-0.2438} \cdot \left(I^{(i)}(1-I^{(i)})\right)^{0.6741} \cdot Q^{-1}(t) \quad (5)$$

where $Q^{-1}(t)$ is an inverse of a Gaussian Q function, and t is selected such that $R^{(--)}+R^{(-+)}+R^{(+-)}+R^{(++)}=4R$. N/4 may represent the same length of the sub-blocks. Additionally, the UE 115-a may determine information bit positions for each quantity of information bits allocated to each sub-block (for example, equivalent to a code design for QPSK).

Additionally, the UE 115-a may interleave each code block with a respective interleaver that may be referred to as a sub-block interleaver. In other words, each sub-block may be associated with a separate interleaver. For example, the interleavers associated with the code blocks may be triangle interleavers associated with cyclic shifts or random shifts, such that each interleaver is associated with a different cyclic shift or different random shift. In some examples, prior to interleaving the code blocks with the sub-block interleavers, the UE 115-a may interleave each code block with row-in column-out interleavers with depth $2^\mu$ to support bit-to-constellation in non-rate-matched scenarios (such as similar to systematic bit priority mapping (SBPM) interleavers for low-density parity check (LDPC) codes). Conversely, for rate-matched scenarios, the UE 115-a may zero-pad a received sequence (for example, in a scenario of shortening) prior to interleaving the code blocks with the sub-block interleavers.

The UE 115-a may transmit, to a receiving wireless communication device, such as the network entity 105-a, a codeword 205 containing the multiple code blocks. That is, the UE 115-a may transmit the respective interleaved bits of each code block over a respective bit channel. For example, the UE 115-a may transmit Bit 2 over channel $W_2$, Bit 3 over channel $W_3$, Bit 1 over channel $W_1$, and Bit 0 over channel $W_0$.

While various aspects are described in the context of four bit channels, this is not to be regarded as a limitation of the present disclosure. In this regard, any quantity of bit channels associated with any quantity of polar code sub-blocks may be considered with reference to the techniques described herein. Further, although various aspects are described in the context of the UE 115-a and the network entity 105-a, this is not to be regarded as a limitation of the present disclosure. The UE 115-a serves as an example of a transmitting wireless communication device and the network entity 105-a serves as an example of a receiving wireless communication device, and any wireless communication device may be considered a transmitting wireless communication device or a receiving wireless communication device.

FIG. 3 shows an example of a rate matching scheme 300 that supports polar coding techniques for higher-order modulation schemes. In some examples, the rate matching scheme 300 may implement or be implemented by aspects of the wireless communications system 100, the wireless communications system 200, or both. For example, the rate matching scheme 300 may be implemented by one or more wireless communication devices, such as by one or more UEs 115, one or more network entities 105, or both, which may be examples of the corresponding devices as described herein.

In some examples, as described previously, an encoder of a UE 115 may round up the block length up to the nearest power of 2 to generate M coded bits 310. In other words, the UE 115 may round up a (N=2$^m$, K) mother code to a (M, K) rate-matched code. As such, the encoder may shorten or puncture a quantity of coded bits 310 in each polar code sub-block 305. In some examples, the quantity of coded bits is equal to a difference between a total block length of the polar code and a length of a codeword including the M coded bits 310 divided by a quantity of bit channels associated used by the UE 115 to transmit the code blocks. That is, continuing with the examples described with reference to FIG. 2 (such as shortening for 256 QAM), the UE 115-a may partition a polar code of total block length N into multiple sub-blocks 305. In some examples, each sub-block 305 has a length of N/4. As such, the encoder may shorten a last $$\frac{N-M}{4}$$

coded bits 310 in each sub-block 305 or puncture a first $$\frac{N-M}{4}$$

coded bits 310 in each sub-block 305. For example, the encoder may partition a polar code into a sub-block 305-a, a sub-block 305-b, a sub-block 305-c, and a sub-block 305-d. Additionally, the encoder may shorten coded bits 310-a in the sub-block 305-a, coded bits 310-b in the sub-block 305-b, coded bits 310-c in the sub-block 305-c, and coded bits 310-d in sub-block 305-d.

For each sub-block 305, information bit selection may be equivalent to a rate-matched polar code design for QPSK. As such, the UE 115-a may support existing polar code construction methods.

Figure 4:
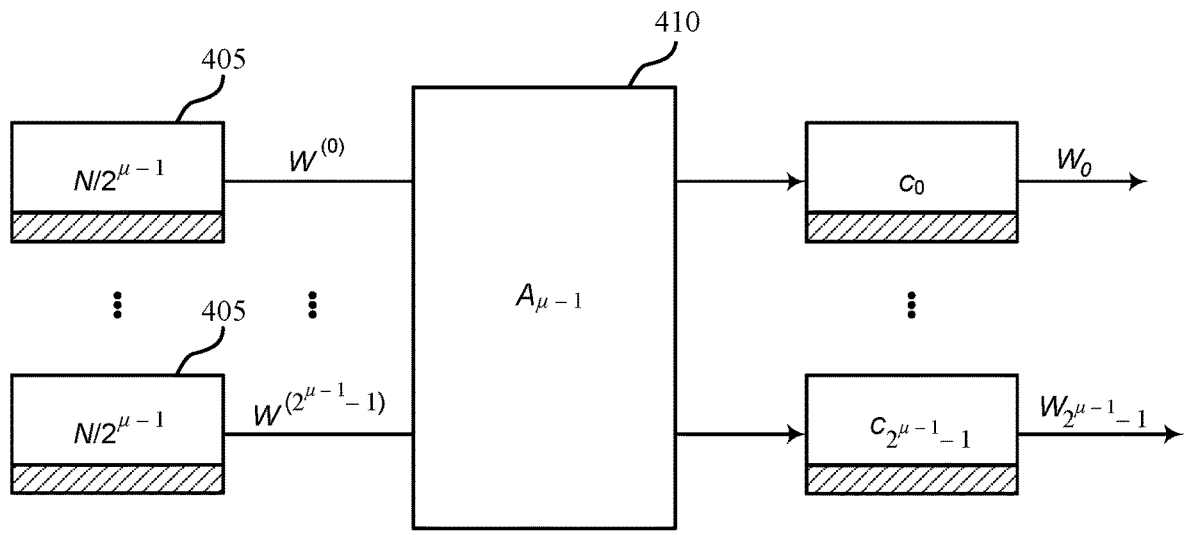
Figure 4:
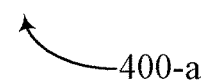
Figure 4:
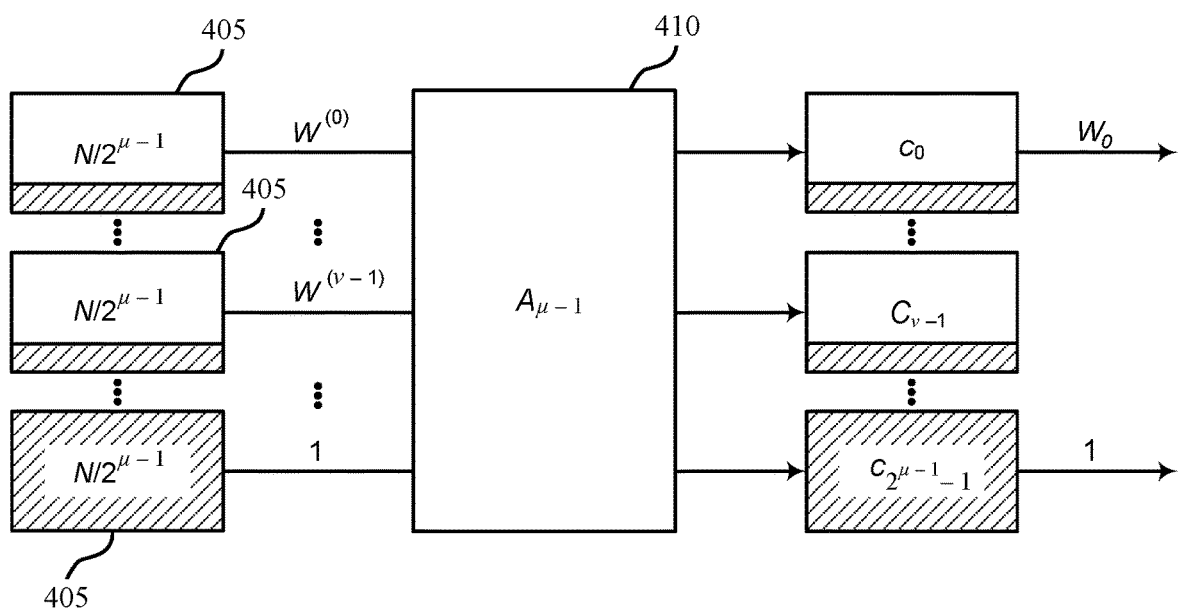

FIG. 4 shows examples of rate matching schemes 400 (such as a rate matching scheme 400-a and a rate matching scheme 400-b) that supports polar coding techniques for higher-order modulation schemes. In some examples, the rate matching schemes 400 may implement or be implemented by aspects of the wireless communications system 100, the wireless communications system 200, the rate matching scheme 300, or any combination thereof. For example, the rate matching schemes 400-a and 400-b may be implemented by one or more wireless communication devices, such as by one or more UEs 115, one or more network entities 105, or both, which may be examples of the corresponding devices as described herein.

In some examples, a UE 115 may support multiple modulation schemes, as such, the UE 115 may support multiple rate matching schemes 400. For example, the UE 115 may support a rate matching scheme 400-a, which may be associated with a first modulation scheme. In some examples, the first modulation scheme is associated with $2^{2^\mu}$ QAM symbols (for example, identical to 256 QAM symbols). In such examples, the UE 115 may use $2^{\mu-1}$ different bit channels (such as $W^0$ to $$W^{(2^{\mu-1}-1)}$$

bit channels) for the transmission of a codeword. Each sub-block 405 may be of a length $$\frac{N}{2\mu-1}$$

and the UE 115 may apply a polar transform 410 (such as $A_{\mu-1}$). In some examples, the UE 115 may shorten a last $$\frac{N-M}{2^{\mu-1}}$$

coded bits 415 in each sub-block 405. Additionally, or alternatively, the UE 115 may puncture a first $$\frac{N-M}{2\mu-1}$$

coded bits in each sub-block.

In another example, the UE 115 may support a rate matching scheme 400-b, which may be associated with a second modulation scheme. In some examples, the second modulation scheme is associated with $2^{2v}$ QAM symbols (such as when v is not a power of 2). In such examples, the UE 115 may add, to a codeword, $2^{\lceil \log_2 v \rceil} - v$ levels associated with a capacity 0, corresponding to blocks being punctured, or a capacity 1, corresponding to blocks being shortened. That is, each sub-block 405 may be of a length $$\frac{N}{2\mu-1},$$

where $\mu-1=\lceil \log_2 v \rceil$, and ine UE 115 may apply a polar transform 410 (such as $A_{\mu-1}$). The UE 115 may shorten a last $$\frac{N-M}{2^{\mu-1}}$$

coded bits 415 in each sub-block 405. In some examples, the UE 115 may puncture a first $$\frac{N-M}{2^{\mu-1}}$$

coded bits in each sub-block 405 to support rate matching. Additionally, the UE 115 may add $2^{\lceil log_2 v \rceil} - v$ levels associated with a capacity of 1 and shorten coded bits 415 (such as all coded bits) associated with the capacity of 1. In some examples, the UE 115 may add $2^{\lceil log_2 v \rceil} - v$ levels associated with a capacity of 0 and shorten coded bits 415 (such as all coded bits) associated with the capacity of 0.

Figure 5:
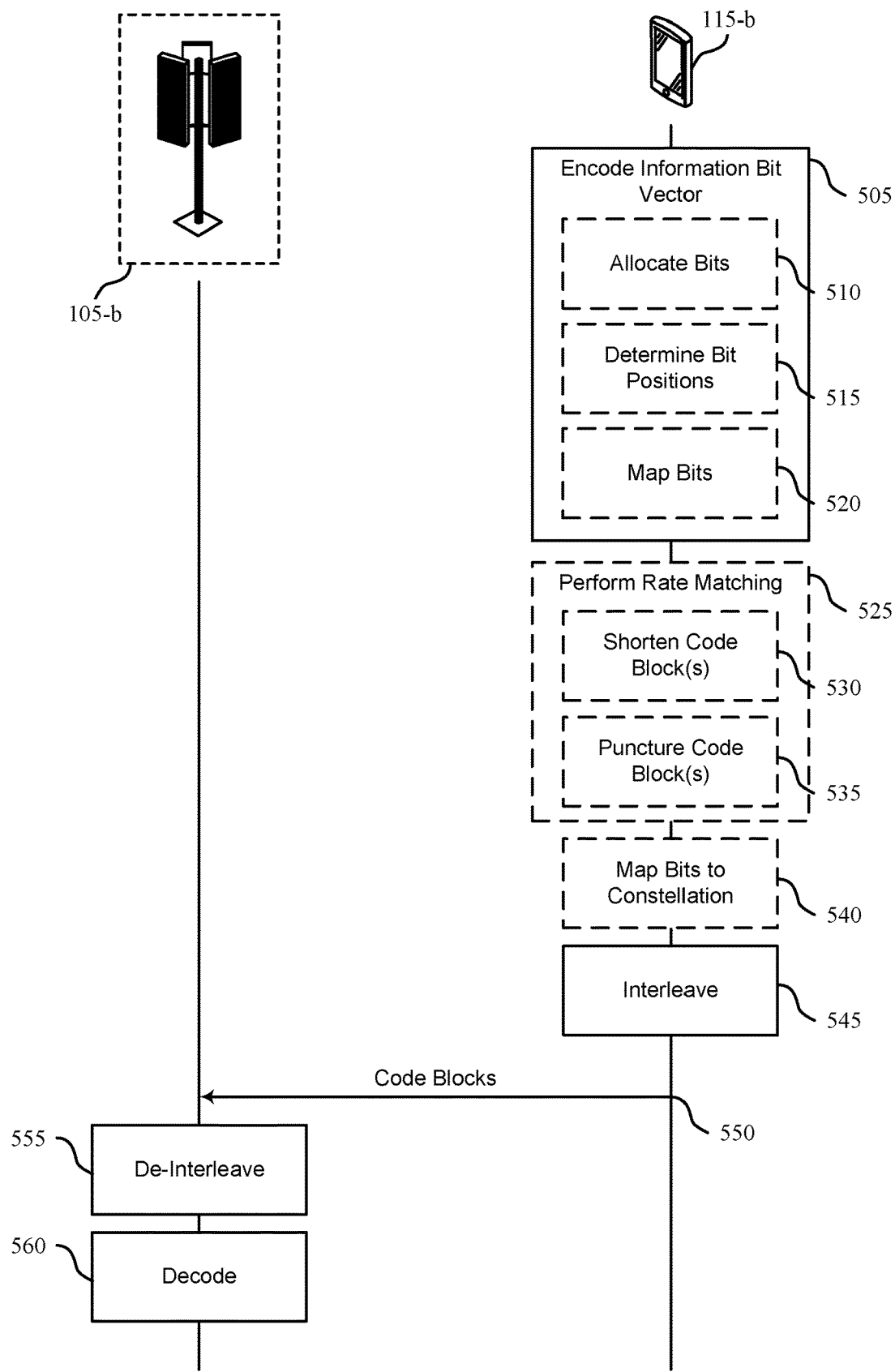
FIG. 5 shows an example of a process flow that supports polar coding techniques for higher-order modulation schemes.

FIG. 5 shows an example of a process flow 500 that supports polar coding techniques for higher-order modulation schemes in accordance with one or more aspects of the present disclosure. In some examples, the process flow 500 may implement or be implemented by aspects of the wireless communications system 100, the wireless communications system 200, the rate matching scheme 300, the rate matching schemes 400, or any combination thereof. For example, the process flow 500 may include one or more transmitting wireless communication devices (such as a UE 115-*b*) and one or more receiving wireless communication devices (such as a network entity 105-*b*), which may be examples of the corresponding devices as described herein.

At 505, the UE 115-*b* may encode an information bit vector into multiple code blocks using a polar code that is partitioned into multiple sub-blocks having a same block length in accordance with a polar transformation associated with a modulation scheme. In such examples, each code block of the multiple code blocks may be encoded using a respective sub-block of the multiple sub-blocks. Additionally, the same block length of each sub-block of the multiple sub-blocks may be equal to a total bock length of the polar code, N, divided by a quantity of bit channels use by the UE 115-*b* to transmit the code blocks.

In some examples, encoding the information bit vector may include, at 510, allocating a respective quantity of bits of the information bit vector to each sub-block of the multiple sub-blocks in accordance with reliabilities respectively associated with the bits of the information bit vector. That is, the UE 115-*b* may be associated with multiple bit channels (such as the quantity of bit channels) and each bit channel may be associated with a different reliability. Additionally, each sub-block may be associated with a bit channel of the multiple bit channels. As such, the UE 115-*b* may allocate the respective quantity of bits of the information bit vector to each sub-block of the multiple sub-blocks in accordance with the reliabilities respectively associated with the bits of the information bit vector and the different reliabilities associated with the bit channels of the multiple bit channels. In other words, bits of the information bit vector associated with a greater reliability (for example, out of the reliabilities respectively associated with the bits of the information bit vector) may be allocated to a sub-block associated with a bit channel that is further associated with a greater reliability (for example, out of the different reliabilities associated with the multiple bit channels)

In some examples (such as in examples where the UE 115-*b* allocates bits according to DE-Q), to allocate the respective quantity of bits of the information bit vector to each sub-block of the multiple sub-blocks, the UE 115-*b* may determine single-bit reliabilities of respective bit-channel sub-blocks for each sub-block of the multiple sub-blocks and may select, for each sub-block of the multiple sub-blocks, respective subsets of the respective bit-channel sub-blocks in accordance with the single-bit reliabilities. That is, for each sub-block, the UE 115-*b* may select K most reliable (such as associated with the K greatest single-bit reliabilities) bit channel sub-blocks of the respective bit-channel sub-blocks. As such, the UE 115-*b* may divide respective sets of bits into partitions allocated to the respective subsets of the respective bit channel sub-blocks for each sub-block in accordance with the single-bit reliabilities.

In some other examples (such as in examples when the UE 115-*b* allocates bits according to FBL-MIP-Q), to allocate the respective quantity of bits of the information bit vector to each sub-block of the multiple sub-blocks, the UE 115-*b* may divide respective sets of bits into partitions allocated to bit-channel sub-blocks for each sub-block of the multiple sub-blocks in accordance with a mutual information transfer function. As such, the respective quantity of bits of the information bit vector may be allocated to each sub-block of the multiple sub-blocks in accordance with the mutual information transfer function. In some examples, the respective sets of bits may be divided recursively, such that the recursive dividing is stopped in accordance with the bit channel sub-blocks being associated with a threshold length. The threshold length may be a fixed length for which the UE 115-*b* may know the information bit positions in accordance with an NR reliability sequence.

In some examples, at 515, the UE 115-*b* may determine a bit position for each bit of the respective quantity of bits allocated to each sub-block of the multiple sub-blocks. As such, each code block of the multiple code blocks may include the respective quantity of bits of the information bit vector in accordance with the bit position. In some examples where the UE 115-*b* allocates bits according to DE-Q, the UE 115-*b* may determine the bit position for each bit of the partitions in each bit channel sub-block in accordance with the single-bit reliabilities. In some examples where the UE 115-*b* allocates bits according to FBL-MIP-Q, the UE 115-*b* may determine the bit position for each bit of the respective quantity of bits in accordance with the bit channel sub-blocks being within the threshold length. In some examples, at 520, the UE 115-*b* may map the bits of the information bit vector to respective bit locations associated with the multiple sub-blocks.

In some examples, at 525, the UE 115-*b* may perform rate matching for the respective quantity of encoded bits associated with each code block in accordance with the same block length of each sub-block. For example, at 530, the UE 115-*b* may shorten a first subset of the respective quantity of the encoded bits associated with each code block. In some examples, the first subset includes a first quantity of the encoded bits at an end of the respective quantity of the encoded bits associated with each code block. The first quantity of encoded bits may be equal to a difference between the total block length of the polar code (such as N) and a length of a codeword (such as M) divided by the quantity of bit channels used by the UE 115-*b* to transmit the code blocks.

Additionally, or alternatively, the UE 115-*b* may shorten the first subset of the respective quantity of the encoded bits associated with one or more code blocks of the multiple code blocks and may shorten all of the encoded bits associated with one or more other code blocks from the multiple code blocks. In some examples, the one or more other code blocks may be associated with a capacity level of 1.

In another example, at 535, the UE 115-*b* may puncture a second subset of the respective quantity of the encoded bits associated with each code block, the second subset comprising a second quantity of the encoded bits at a beginning of the respective quantity of the encoded bits associated with each code block. Similarly, the second quantity of encoded bits may be equal to the difference between the total block length of the polar code (such as N) and the length of a codeword (such as M) divided by the quantity of bit channels used by the UE 115-*b* to transmit the code blocks.

Additionally, or alternatively, the UE 115-*b* may puncture the second subset of the respective quantity of the encoded bits associated with one or more code blocks of the multiple code blocks and may puncture all of the encoded bits associated with one or more other code blocks from the multiple code blocks. In some examples, the one or more other code blocks may be associated with a capacity level of 0.

In some examples, at 540, the UE 115-*b* may map the encoded bits to a constellation in accordance with a row-in column-out interleaving scheme, the encoded bits being mapped to the constellation prior to interleaving each code block.

At 545, the UE 115-*b* may interleave the respective bits of each code block of the multiple code blocks using a respective interleaver of multiple interleavers. That is, each interleaver of the multiple interleavers may be associated with different code blocks of the multiple code blocks, such that each interleaver is different. For example, the multiple interleavers may be triangle interleavers, such that each interleaver is associated with a different cyclic or random shift. The bits of each code block may be interleaved in accordance with the respective bit locations.

At 550, the UE 115-*b* may transmit, to the network entity 105-*b*, the respective interleaved bits of each code block of the multiple code blocks over a respective bit channel of the multiple bit channels. That is, the network entity 105-*b* may receive (for example, obtain) a signal representing the multiple code blocks (such as including the information bit vector) over the multiple bit channels.

At 555, the network entity 105-*b* may de-interleave each code block of the multiple code blocks using multiple de-interleavers. In some examples, each de-interleaver is associated with a respective code block of the multiple code blocks. That is, the network entity 105-*b* may de-interleave each code block using multiple de-interleavers in accordance with each code block being interleaved with a different interleaver.

At 560, the network entity 105-*b* may decode the multiple code blocks according to the polar code (for example, according to the multiple sub-blocks) to obtain the information bit vector.

Although some examples are described in the context of the UE 115-*b* and the network entity 105-*b*, this is not to be regarded as a limitation of the present disclosure. In this regard, the UE 115-*b* serves as an example of a transmitting wireless communication device and the network entity 105-*b* serves as an example of a receiving wireless communication device, such that any wireless communication wireless communication device may be considered a transmitting wireless communication device or a receiving wireless communication device.

Figure 6:
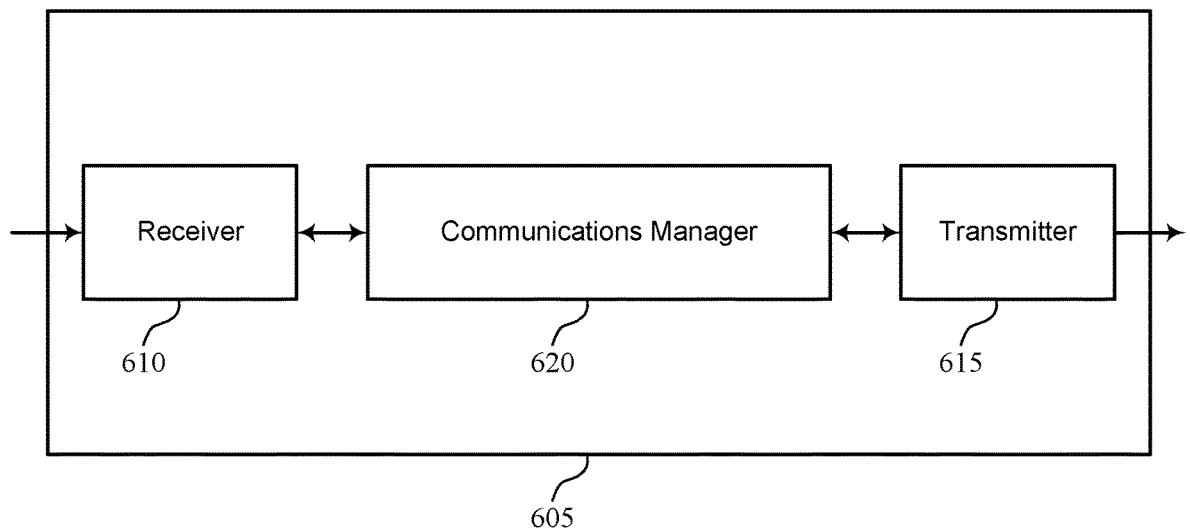
FIGS. 6 and 7 show block diagrams of example wireless communication devices that support polar coding techniques for higher-order modulation schemes.

FIG. 6 shows a block diagram of an example wireless communication device 605 that supports polar coding techniques for higher-order modulation schemes. The wireless communication device 605 may be an example of aspects of a UE 115 or a network entity 105 as described herein. The wireless communication device 605 may include a receiver 610, a transmitter 615, and a communications manager 620. The wireless communication device 605, or one or more components of the wireless communication device 605 (such as the receiver 610, the transmitter 615, and the communications manager 620), may include at least one processor, which may be coupled with at least one memory, to, individually or collectively, support or enable the described techniques. Each of these components may be in communication with one another (such as via one or more buses).

The receiver 610 may provide a means for receiving information such as packets, user data, control information, or any combination thereof associated with various information channels (such as control channels, data channels, information channels related to polar coding techniques for higher-order modulation). Information may be passed on to other components of the wireless communication device 605. The receiver 610 may utilize a single antenna or a set of multiple antennas.

The transmitter 615 may provide a means for transmitting signals generated by other components of the wireless communication device 605. For example, the transmitter 615 may transmit information such as packets, user data, control information, or any combination thereof associated with various information channels (such as control channels, data channels, information channels related to polar coding techniques for higher-order modulation). In some examples, the transmitter 615 may be co-located with a receiver 610 in a transceiver module. The transmitter 615 may utilize a single antenna or a set of multiple antennas.

The communications manager 620, the receiver 610, the transmitter 615, or various combinations thereof or various components thereof may be examples of means for performing various aspects of polar coding techniques for higher-order modulation as described herein. For example, the communications manager 620, the receiver 610, the transmitter 615, or various combinations or components thereof may be capable of performing one or more of the functions described herein.

In some examples, the communications manager 620, the receiver 610, the transmitter 615, or various combinations or components thereof may be implemented in hardware (such as in communications management circuitry). The hardware may include at least one of a processor, a digital signal processor (DSP), a central processing unit (CPU), an application-specific integrated circuit (ASIC), a field-programmable gate array (FPGA) or other programmable logic device, a microcontroller, discrete gate or transistor logic, discrete hardware components, or any combination thereof configured as or otherwise supporting, individually or collectively, a means for performing the functions described in the present disclosure. In some examples, at least one processor and at least one memory coupled with the at least one processor may be configured to perform one or more of the functions described herein (such as by one or more processors, individually or collectively, executing instructions stored in the at least one memory).

Additionally, or alternatively, the communications manager 620, the receiver 610, the transmitter 615, or various combinations or components thereof may be implemented in code (such as communications management software or firmware) executed by at least one processor. If implemented in code executed by at least one processor, the functions of the communications manager 620, the receiver 610, the transmitter 615, or various combinations or components thereof may be performed by a general-purpose processor, a DSP, a CPU, an ASIC, an FPGA, a microcontroller, or any combination of these or other programmable logic devices (for example, configured as or otherwise supporting, individually or collectively, a means for performing the functions described in the present disclosure).

In some examples, the communications manager 620 may be configured to perform various operations (such as receiving, obtaining, monitoring, outputting, transmitting) using or otherwise in cooperation with the receiver 610, the transmitter 615, or both. For example, the communications manager 620 may receive information from the receiver 610, send information to the transmitter 615, or be integrated in combination with the receiver 610, the transmitter 615, or both to obtain information, output information, or perform various other operations as described herein.

The communications manager 620 may support wireless communications in accordance with examples as disclosed herein. For example, the communications manager 620 is capable of, configured to, or operable to support a means for encoding an information bit vector into a set of multiple code blocks using a polar code that is partitioned into a set of multiple sub-blocks having a same block length in accordance with a polar transformation associated with a modulation scheme, each code block of the set of multiple code blocks being encoded using a respective sub-block of the set of multiple sub-blocks. The communications manager 620 is capable of, configured to, or operable to support a means for interleaving respective bits of each code block of the set of multiple code blocks using a respective interleaver of a set of multiple interleavers. The communications manager 620 is capable of, configured to, or operable to support a means for transmitting the respective interleaved bits of each code block of the set of multiple code blocks over a respective bit channel of a set of multiple bit channels, each bit channel of the set of multiple bit channels being associated with a respective reliability.

Additionally, or alternatively, the communications manager 620 may support wireless communications in accordance with examples as disclosed herein. For example, the communications manager 620 is capable of, configured to, or operable to support a means for receiving a signal representing a set of multiple code blocks over a set of multiple bit channels, the set of multiple code blocks encoded using a polar code that is partitioned into a set of multiple sub-blocks having a same block length in accordance with a polar transformation associated with a modulation scheme. In some examples, each bit channel of the set of multiple bit channels is associated with a respective reliability. The communications manager 620 is capable of, configured to, or operable to support a means for de-interleaving each code block of the set of multiple code blocks using a set of multiple de-interleavers, each de-interleaver of the set of multiple de-interleavers associated with a respective code block of the set of multiple code blocks, and the set of multiple code blocks collectively including an information bit vector. The communications manager 620 is capable of, configured to, or operable to support a means for decoding the set of multiple code blocks according to the polar code to obtain the information bit vector.

By including or configuring the communications manager 620 in accordance with examples as described herein, the wireless communication device 605 (such as at least one processor controlling or otherwise coupled with the receiver 610, the transmitter 615, the communications manager 620, or a combination thereof) may support techniques for partitioning a polar code into multiple sub-blocks for encoding of an information bit vector, which may result in reduced processing, reduced power consumption, and more efficient utilization of communication resources, among other advantages.

Figure 7:
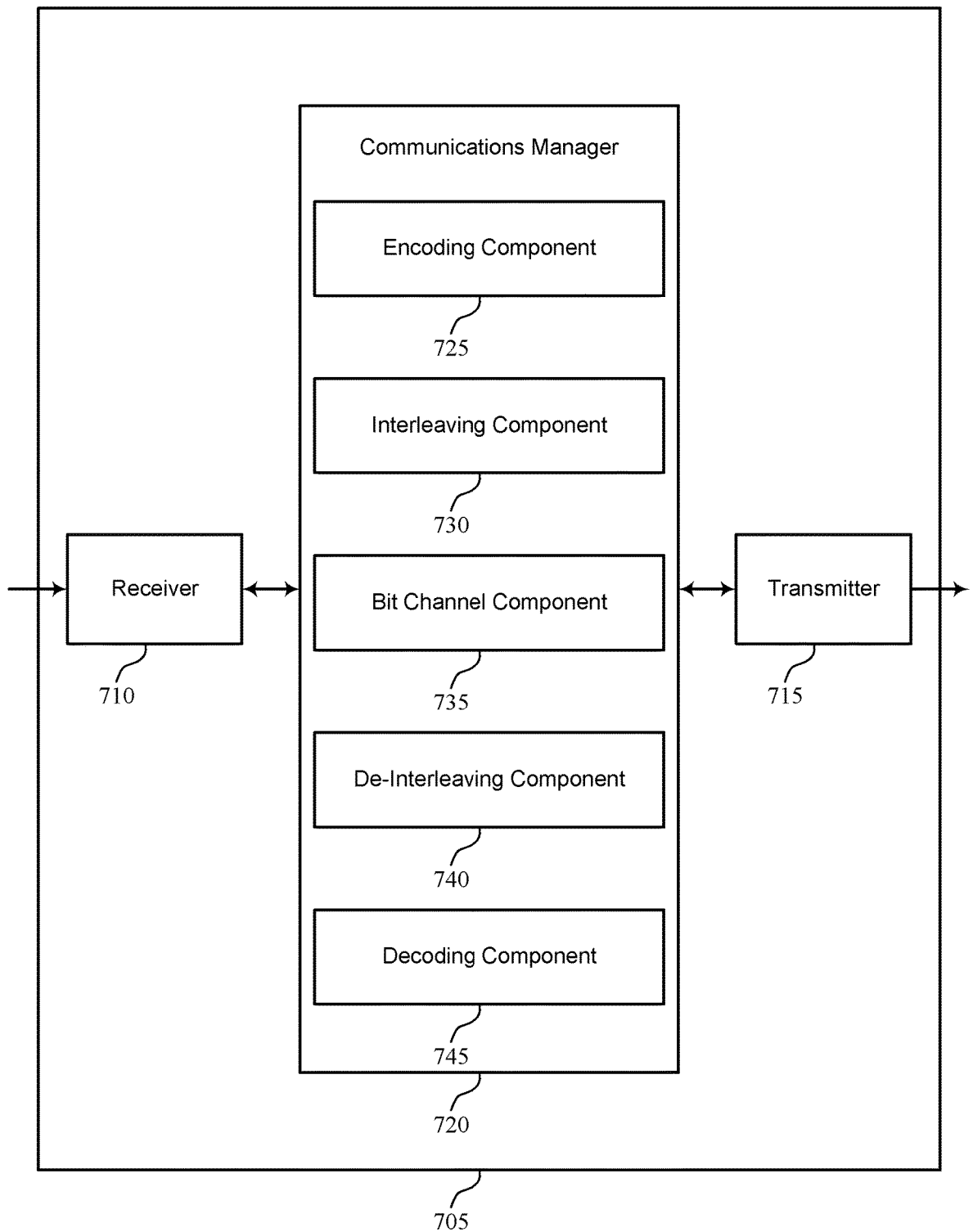

FIG. 7 shows a block diagram of an example wireless communication device 705 that supports polar coding techniques for higher-order modulation schemes. The wireless communication device 705 may be an example of aspects of a wireless communication device 605, a UE 115, or a network entity 105 as described herein. The wireless communication device 705 may include a receiver 710, a transmitter 715, and a communications manager 720. The wireless communication device 705, or one of more components of the wireless communication device 705 (such as the receiver 710, the transmitter 715, and the communications manager 720), may include at least one processor, which may be coupled with at least one memory, to support the described techniques. Each of these components may be in communication with one another (such as via one or more buses). The communications manager 720 can be implemented, at least in part, by one or both of a modem and a processor.

The receiver 710 may provide a means for receiving information such as packets, user data, control information, or any combination thereof associated with various information channels (such as control channels, data channels, information channels related to polar coding techniques for higher-order modulation schemes). Information may be passed on to other components of the wireless communication device 705. The receiver 710 may utilize a single antenna or a set of multiple antennas.

The transmitter 715 may provide a means for transmitting signals generated by other components of the wireless communication device 705. For example, the transmitter 715 may transmit information such as packets, user data, control information, or any combination thereof associated with various information channels (such as control channels, data channels, information channels related to polar coding techniques for higher-order modulation schemes). In some examples, the transmitter 715 may be co-located with a receiver 710 in a transceiver module. The transmitter 715 may utilize a single antenna or a set of multiple antennas.

The wireless communication device 705, or various components thereof, may be an example of means for performing various aspects of polar coding techniques for higher-order modulation as described herein. For example, the communications manager 720 may include an encoding component 725, an interleaving component 730, a bit channel component 735, a de-interleaving component 740, a decoding component 745, or any combination thereof. The communications manager 720 may be an example of aspects of a communications manager 620 as described herein. In some examples, the communications manager 720, or various components thereof, may be configured to perform various operations (such as receiving, obtaining, monitoring, outputting, transmitting) using or otherwise in cooperation with the receiver 710, the transmitter 715, or both. For example, the communications manager 720 may receive information from the receiver 710, send information to the transmitter 715, or be integrated in combination with the receiver 710, the transmitter 715, or both to obtain information, output information, or perform various other operations as described herein.

The communications manager 720 may support wireless communications in accordance with examples as disclosed herein. The encoding component 725 is capable of, configured to, or operable to support a means for encoding an information bit vector into a set of multiple code blocks using a polar code that is partitioned into a set of multiple sub-blocks having a same block length in accordance with a polar transformation associated with a modulation scheme, each code block of the set of multiple code blocks being encoded using a respective sub-block of the set of multiple sub-blocks. The interleaving component 730 is capable of, configured to, or operable to support a means for interleaving respective bits of each code block of the set of multiple code blocks using a respective interleaver of a set of multiple interleavers. The bit channel component 735 is capable of, configured to, or operable to support a means for transmitting the respective interleaved bits of each code block of the set of multiple code blocks over a respective bit channel of a set of multiple bit channels, each bit channel of the set of multiple bit channels being associated with a respective reliability.

Additionally, or alternatively, the communications manager 720 may support wireless communications in accordance with examples as disclosed herein. The bit channel component 735 is capable of, configured to, or operable to support a means for receiving a signal representing a set of multiple code blocks over a set of multiple bit channels, the set of multiple code blocks encoded using a polar code that is partitioned into a set of multiple sub-blocks having a same block length in accordance with a polar transformation associated with a modulation scheme. In some examples, each bit channel of the set of multiple bit channels is associated with a respective reliability. The de-interleaving component 740 is capable of, configured to, or operable to support a means for de-interleaving each code block of the set of multiple code blocks using a set of multiple de-interleavers, each de-interleaver of the set of multiple de-interleavers associated with a respective code block of the set of multiple code blocks, and the set of multiple code blocks collectively including an information bit vector. The decoding component 745 is capable of, configured to, or operable to support a means for decoding the set of multiple code blocks according to the polar code to obtain the information bit vector.

Figure 8:
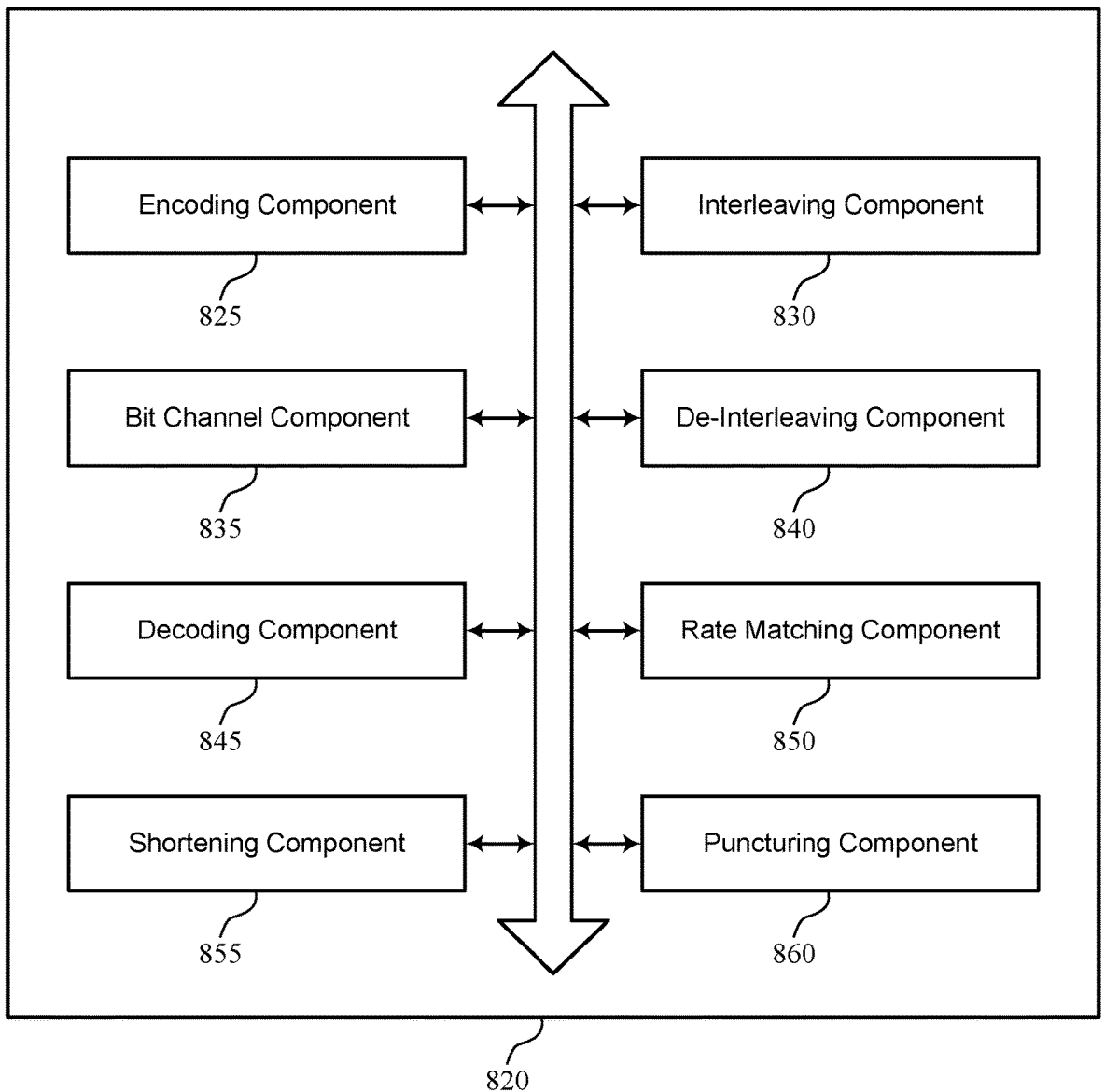
FIG. 8 shows a block diagram of an example communications manager that supports polar coding techniques for higher-order modulation schemes.

FIG. 8 shows a block diagram of an example communications manager 820 that supports polar coding techniques for higher-order modulation schemes. The communications manager 820, or various components thereof, may be an example of means for performing various aspects of polar coding techniques for higher-order modulation schemes as described herein. For example, the communications manager 820 may include an encoding component 825, an interleaving component 830, a bit channel component 835, a de-interleaving component 840, a decoding component 845, a rate matching component 850, a shortening component 855, a puncturing component 860, or any combination thereof. Each of these components, or components or sub-components thereof (such as one or more processors, one or more memories), may communicate, directly or indirectly, with one another (such as via one or more buses), which may include communications within a protocol layer of a protocol stack, communications associated with a logical channel of a protocol stack (such as between protocol layers of a protocol stack, within a device, component, or virtualized component associated with a network entity 105, between devices, components, or virtualized components associated with a network entity 105), or any combination thereof.

The communications manager 820 may support wireless communications in accordance with examples as disclosed herein. The encoding component 825 is capable of, configured to, or operable to support a means for encoding an information bit vector into a set of multiple code blocks using a polar code that is partitioned into a set of multiple sub-blocks having a same block length in accordance with a polar transformation associated with a modulation scheme, each code block of the set of multiple code blocks being encoded using a respective sub-block of the set of multiple sub-blocks. The interleaving component 830 is capable of, configured to, or operable to support a means for interleaving respective bits of each code block of the set of multiple code blocks using a respective interleaver of a set of multiple interleavers. The bit channel component 835 is capable of, configured to, or operable to support a means for transmitting the respective interleaved bits of each code block of the set of multiple code blocks over a respective bit channel of a set of multiple bit channels, each bit channel of the set of multiple bit channels being associated with a respective reliability.

In some examples, to support encoding the information bit vector, the encoding component 825 is capable of, configured to, or operable to support a means for mapping bits of the information bit vector to respective bit locations associated with the set of multiple sub-blocks. In some examples, the bits of each code block are interleaved in accordance with the respective bit locations.

In some examples, to support encoding the information bit vector, the encoding component 825 is capable of, configured to, or operable to support a means for allocating a respective quantity of bits of the information bit vector to each sub-block of the set of multiple sub-blocks in accordance with reliabilities respectively associated with the bits of the information bit vector. In some examples, to support encoding the information bit vector, the encoding component 825 is capable of, configured to, or operable to support a means for determining a bit position for each bit of the respective quantity of bits allocated to each sub-block of the set of multiple sub-blocks. In some examples, each code block of the set of multiple code blocks includes the respective quantity of bits of the information bit vector in accordance with the bit positions.

In some examples, to support allocating the quantities of bits of the information bit vector to the set of multiple sub-blocks, the encoding component 825 is capable of, configured to, or operable to support a means for calculating single-bit reliabilities of respective bit channel sub-blocks for each sub-block of the set of multiple sub-blocks. In some examples, to support allocating the quantities of bits of the information bit vector to the set of multiple sub-blocks, the encoding component 825 is capable of, configured to, or operable to support a means for selecting respective subsets of the respective bit channel sub-blocks for each sub-block of the set of multiple sub-blocks in accordance with the single-bit reliabilities. In some examples, to support allocating the quantities of bits of the information bit vector to the set of multiple sub-blocks, the encoding component 825 is capable of, configured to, or operable to support a means for dividing respective sets of bits into partitions allocated to the respective subsets of the respective bit channel sub-blocks for each sub-block of the set of multiple sub-blocks in accordance with the single-bit reliabilities.

In some examples, to support determining the bit position for each bit of the respective quantity of bits, the encoding component 825 is capable of, configured to, or operable to support a means for determining the bit position for each bit of the partitions in each bit channel sub-block in accordance with the single-bit reliabilities.

In some examples, to support allocating the respective quantity of bits of the information bit vector to each sub-block of the set of multiple sub-blocks, the encoding component 825 is capable of, configured to, or operable to support a means for dividing respective sets of bits into partitions allocated to bit channel sub-blocks for each sub-block of the set of multiple sub-blocks. In some examples, the respective sets of bits are divided in accordance with a mutual information transfer function. In some examples, the respective quantity of bits is allocated to each sub-block of the set of multiple sub-blocks in accordance with the mutual information transfer function.

In some examples, the respective sets of bits are divided into partitions recursively. In some examples, the recursive dividing is stopped based on the bit channel sub-blocks being associated with a threshold length. In some examples, determining the bit position for each bit of the respective quantity of bits is based on the bit channel sub-blocks being associated with the threshold length.

In some examples, each code block is associated with a respective quantity of encoded bits, and the rate matching component 850 is capable of, configured to, or operable to support a means for performing rate matching for the respective quantity of the encoded bits associated with each code block in accordance with the same block length of each sub-block.

In some examples, to support performing the rate matching for the respective quantity of the encoded bits, the shortening component 855 is capable of, configured to, or operable to support a means for shortening a subset of the respective quantity of the encoded bits associated with each code block, the subset including a first quantity of the encoded bits at an end of the respective quantity of the encoded bits associated with each code block.

In some examples, the first quantity of the encoded bits is equal to a difference between a total block length of the polar code and a length of a codeword including the set of multiple code blocks divided by a quantity of the set of multiple bit channels.

In some examples, to support performing the rate matching for the respective quantity of the encoded bits, the puncturing component 860 is capable of, configured to, or operable to support a means for puncturing a subset of the respective quantity of the encoded bits associated with each code block, the subset including a first quantity of the encoded bits at a beginning of the respective quantity of the encoded bits associated with each code block.

In some examples, the first quantity of the encoded bits is equal to a difference between a total block length of the polar code and a length of a codeword including the set of multiple code blocks divided by a quantity of the set of multiple bit channels.

In some examples, to support performing the rate matching for the respective quantity of the encoded bits, the shortening component 855 is capable of, configured to, or operable to support a means for shortening a subset of the respective quantity of the encoded bits associated with one or more code blocks from the set of multiple code blocks, the subset of the respective quantity of the encoded bits including a first quantity of the encoded bits at an end of the respective quantity of the encoded bits associated with the one or more code blocks. In some examples, to support performing the rate matching for the respective quantity of the encoded bits, the shortening component 855 is capable of, configured to, or operable to support a means for shortening all of the encoded bits associated with one or more other code blocks from the set of multiple code blocks. In some examples, the one or more other code blocks are associated with a capacity level of 1.

In some examples, to support performing the rate matching for the respective quantity of the encoded bits, the puncturing component 860 is capable of, configured to, or operable to support a means for puncturing a subset of the respective quantity of the encoded bits associated with one or more code blocks from the set of multiple code blocks, the subset of the respective quantity of the encoded bits including a first quantity of the encoded bits at a beginning of the respective quantity of the encoded bits associated with the one or more code blocks. In some examples, to support performing the rate matching for the respective quantity of the encoded bits, the puncturing component 860 is capable of, configured to, or operable to support a means for puncturing all of the encoded bits associated with one or more other code blocks from the set of multiple code blocks. In some examples, the one or more other code blocks are associated with a capacity level of 0.

In some examples, a total block length of the polar code is equal to N. In some examples, the same block length of each sub-block of the set of multiple sub-blocks is equal to N divided by a quantity of the set of multiple bit channels.

In some examples, the encoding component 825 is capable of, configured to, or operable to support a means for mapping encoded bits to a constellation in accordance with a row-in column-out interleaving scheme, the encoded bits being mapped to the constellation prior to interleaving each code block using the respective interleaver of the set of multiple interleavers.

In some examples, each interleaver of the set of multiple interleavers is different in accordance with each interleaver being associated with different code blocks of the set of multiple code blocks.

Additionally, or alternatively, the communications manager 820 may support wireless communications in accordance with examples as disclosed herein. In some examples, the bit channel component 835 is capable of, configured to, or operable to support a means for receiving a signal representing a set of multiple code blocks over a set of multiple bit channels, the set of multiple code blocks encoded using a polar code that is partitioned into a set of multiple sub-blocks having a same block length in accordance with a polar transformation associated with a modulation scheme. In some examples, each bit channel of the set of multiple bit channels is associated with a respective reliability. The de-interleaving component 840 is capable of, configured to, or operable to support a means for de-interleaving each code block of the set of multiple code blocks using a set of multiple de-interleavers, each de-interleaver of the set of multiple de-interleavers associated with a respective code block of the set of multiple code blocks, and the set of multiple code blocks collectively including an information bit vector. The decoding component 845 is capable of, configured to, or operable to support a means for decoding the set of multiple code blocks according to the polar code to obtain the information bit vector.

In some examples, bits of the information bit vector are mapped to respective bit locations associated with the set of multiple sub-blocks. In some examples, a respective quantity of bits of the information bit vector is allocated to each sub-block of the set of multiple sub-blocks in accordance with reliabilities respectively associated with the bits of the information bit vector. In some examples, each code block of the set of multiple code blocks includes the respective quantity of bits of the information bit vector in accordance with bit positions.

In some examples, respective sets of bits are divided into partitions allocated to bit channel sub-blocks for each sub-block of the set of multiple sub-blocks in accordance with single-bit reliabilities respectively associated with the bit channel sub-blocks. In some examples, the bit channel sub-blocks for each sub-block are selected from a set of multiple bit channel sub-blocks in accordance with the single-bit reliabilities respectively associated with the bit channel sub-blocks.

In some examples, respective sets of bits are divided into partitions allocated to bit channel sub-blocks for each sub-block of the set of multiple sub-blocks in accordance with a mutual information transfer function. In some examples, the respective quantity of the bits is allocated to each sub-block of the set of multiple sub-blocks in accordance with the mutual information transfer function.

In some examples, each code block is associated with a respective quantity of encoded bits, the respective quantity of the encoded bits being rate matched in accordance with the same block length of each sub-block.

In some examples, a subset of the respective quantity of the encoded bits associated with each code block is shortened, the subset including a first quantity of the encoded bits at an end of the respective quantity of the encoded bits.

In some examples, the first quantity of the encoded bits is equal to a difference between a total block length of the polar code and a length of a codeword including the set of multiple code blocks divided by a quantity of the set of multiple bit channels.

In some examples, a subset of the respective quantity of the encoded bits associated with each code block is punctured, the subset including a first quantity of the encoded bits at a beginning of the respective quantity of the encoded bits.

In some examples, the first quantity of the encoded bits is equal to a difference between a total block length of the polar code and a length of a codeword including the set of multiple code blocks divided by a quantity of the set of multiple bit channels.

In some examples, a subset of the respective quantity of the encoded bits for one or more code blocks from the set of multiple code blocks is shortened, the subset of the respective quantity of the encoded bits including a first quantity of the encoded bits at an end of the respective quantity of the encoded bits associated with the one or more code blocks, and all of the encoded bits associated with one or more other code blocks from the set of multiple code blocks are shortened. In some examples, the one or more other code blocks are associated with a capacity level of 1.

In some examples, a subset of the respective quantity of the encoded bits for one or more code blocks from the set of multiple code blocks is punctured, the subset of the respective quantity of the encoded bits including a first quantity of the encoded bits at a beginning of the respective quantity of the encoded bits associated with the one or more code blocks, and all of the encoded bits associated with one or more other code blocks of the set of multiple code blocks are punctured. In some examples, the one or more other code blocks are associated with a capacity level of 0.

In some examples, a total block length of the polar code is equal to N. In some examples, the same block length of each sub-block of the set of multiple sub-blocks is equal to N divided by a quantity of the set of multiple bit channels.

Figure 9:
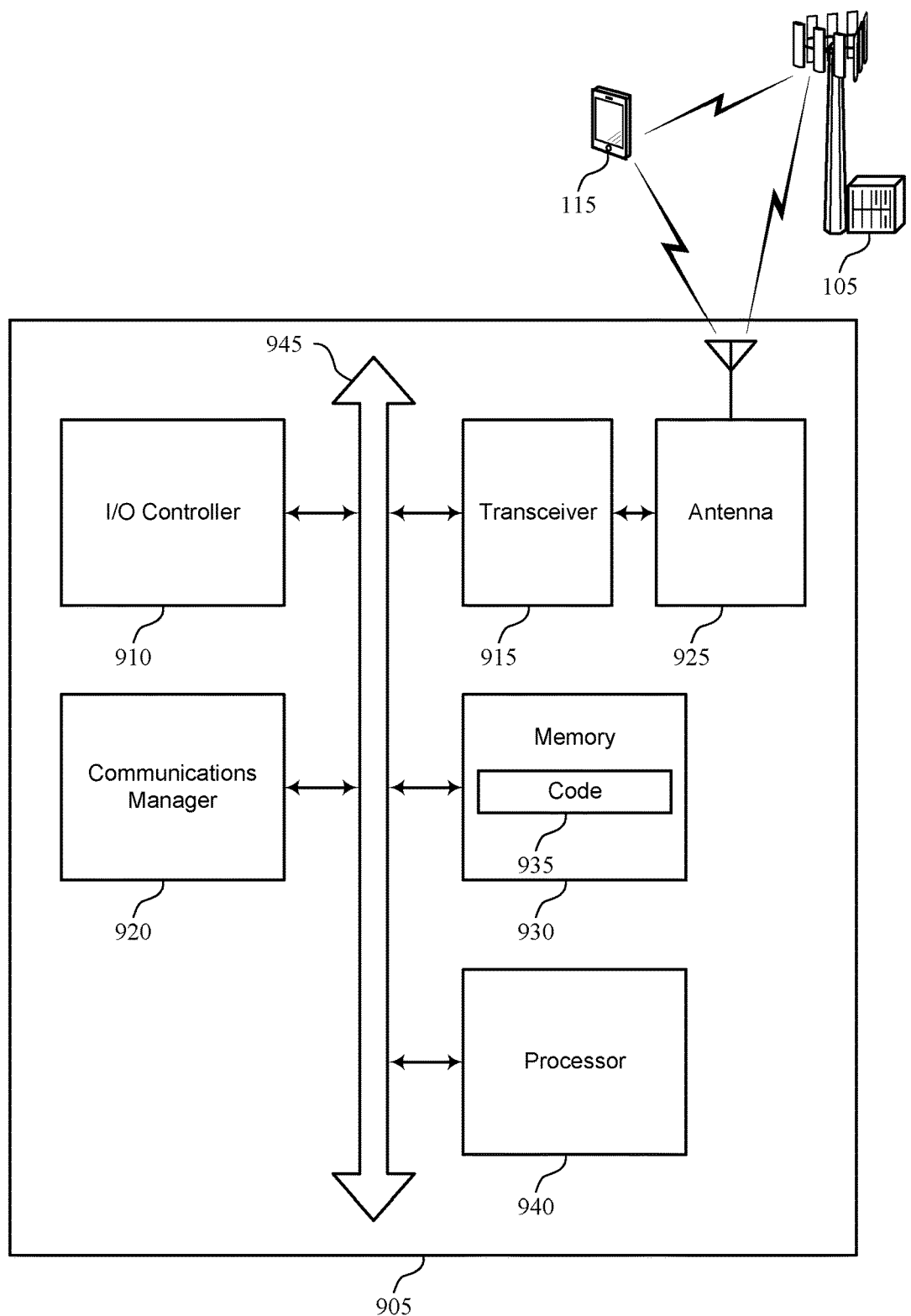
FIGS. 9 and 10 show diagrams of an example system including a wireless communication device that supports polar coding techniques for higher-order modulation schemes.

FIG. 9 shows a diagram of an example system including a wireless communication device 905 that supports polar coding techniques for higher-order modulation in accordance with one or more aspects of the present disclosure. The wireless communication device 905 may be an example of or include the components of a wireless communication device 605, a wireless communication device 705, or a UE 115 as described herein. The wireless communication device 905 may communicate (for example, wirelessly) with one or more network entities 105, one or more UEs 115, or any combination thereof. The wireless communication device 905 may include components for bi-directional voice and data communications including components for transmitting and receiving communications, such as a communications manager 920, an input/output (I/O) controller 910, a transceiver 915, an antenna 925, at least one memory 930, code 935, and at least one processor 940. These components may be in electronic communication or otherwise coupled (for example, operatively, communicatively, functionally, electronically, electrically) via one or more buses (such as a bus 945).

The I/O controller 910 may manage input and output signals for the wireless communication device 905. The I/O controller 910 may also manage peripherals not integrated into the wireless communication device 905. In some examples, the I/O controller 910 may represent a physical connection or port to an external peripheral. In some examples, the I/O controller 910 may utilize an operating system such as iOS®, ANDROID®, MS-DOS®, MS-WINDOWS®, OS/2®, UNIX®, LINUX®, or another known operating system. Additionally, or alternatively, the I/O controller 910 may represent or interact with a modem, a keyboard, a mouse, a touchscreen, or a similar wireless communication device. In some examples, the I/O controller 910 may be implemented as part of one or more processors, such as the at least one processor 940. In some examples, a user may interact with the wireless communication device 905 via the I/O controller 910 or via hardware components controlled by the I/O controller 910.

In some examples, the wireless communication device 905 may include a single antenna 925. However, in some other examples, the wireless communication device 905 may have more than one antenna 925, which may be capable of concurrently transmitting or receiving multiple wireless transmissions. The transceiver 915 may communicate bi-directionally, via the one or more antennas 925, wired, or wireless links as described herein. For example, the transceiver 915 may represent a wireless transceiver and may communicate bi-directionally with another wireless transceiver. The transceiver 915 may also include a modem to modulate the packets, to provide the modulated packets to one or more antennas 925 for transmission, and to demodulate packets received from the one or more antennas 925. The transceiver 915, or the transceiver 915 and one or more antennas 925, may be an example of a transmitter 615, a transmitter 715, a receiver 610, a receiver 710, or any combination thereof or component thereof, as described herein.

The at least one memory 930 may include random access memory (RAM) and read-only memory (ROM). The at least one memory 930 may store computer-readable, computer-executable code 935 including instructions that, when executed by the at least one processor 940, cause the wireless communication device 905 to perform various functions described herein. The code 935 may be stored in a non-transitory computer-readable medium such as system memory or another type of memory. In some examples, the code 935 may not be directly executable by the at least one processor 940 but may cause a computer (for example, when compiled and executed) to perform functions described herein. In some examples, the at least one memory 930 may contain, among other things, a basic I/O system (BIOS), which may control basic hardware or software operation such as the interaction with peripheral components or devices.

The at least one processor 940 may include an intelligent hardware device (such as a general-purpose processor, a DSP, a CPU, a microcontroller, an ASIC, an FPGA, a programmable logic device, a discrete gate or transistor logic component, a discrete hardware component, or any combination thereof). In some examples, the at least one processor 940 may be configured to operate a memory array using a memory controller. In some other examples, a memory controller may be integrated into the at least one processor 940. The at least one processor 940 may be configured to execute computer-readable instructions stored in a memory (such as the at least one memory 930) to cause the wireless communication device 905 to perform various functions (such as functions or tasks supporting polar coding techniques for higher-order modulation). For example, the wireless communication device 905 or a component of the wireless communication device 905 may include at least one processor 940 and at least one memory 930 coupled with or to the at least one processor 940, the at least one processor 940 and at least one memory 930 configured to perform various functions described herein. In some examples, the at least one processor 940 may include multiple processors and the at least one memory 930 may include multiple memories. One or more of the multiple processors may be coupled with one or more of the multiple memories, which may, individually or collectively, be configured to perform various functions herein.

The communications manager 920 may support wireless communications in accordance with examples as disclosed herein. For example, the communications manager 920 is capable of, configured to, or operable to support a means for encoding an information bit vector into a set of multiple code blocks using a polar code that is partitioned into a set of multiple sub-blocks having a same block length in accordance with a polar transformation associated with a modulation scheme, each code block of the set of multiple code blocks being encoded using a respective sub-block of the set of multiple sub-blocks. The communications manager 920 is capable of, configured to, or operable to support a means for interleaving respective bits of each code block of the set of multiple code blocks using a respective interleaver of a set of multiple interleavers. The communications manager 920 is capable of, configured to, or operable to support a means for transmitting the respective interleaved bits of each code block of the set of multiple code blocks over a respective bit channel of a set of multiple bit channels, each bit channel of the set of multiple bit channels being associated with a respective reliability.

Additionally, or alternatively, the communications manager 920 may support wireless communications in accordance with examples as disclosed herein. For example, the communications manager 920 is capable of, configured to, or operable to support a means for receiving a signal representing a set of multiple code blocks over a set of multiple bit channels, the set of multiple code blocks encoded using a polar code that is partitioned into a set of multiple sub-blocks having a same block length in accordance with a polar transformation associated with a modulation scheme. In some examples, each bit channel of the set of multiple bit channels is associated with a respective reliability. The communications manager 920 is capable of, configured to, or operable to support a means for de-interleaving each code block of the set of multiple code blocks using a set of multiple de-interleavers, each de-interleaver of the set of multiple de-interleavers associated with a respective code block of the set of multiple code blocks, and the set of multiple code blocks collectively including an information bit vector. The communications manager 920 is capable of, configured to, or operable to support a means for decoding the set of multiple code blocks according to the polar code to obtain the information bit vector.

By including or configuring the communications manager 920 in accordance with examples as described herein, the wireless communication device 905 may support techniques partitioning a polar code into multiple sub-blocks for encoding of an information bit vector, which may result in improved communication reliability, reduced latency, improved user experience related to reduced processing, reduced power consumption, more efficient utilization of communication resources, improved coordination between devices, longer battery life, and improved utilization of processing capability, among other advantages.

In some examples, the communications manager 920 may be configured to perform various operations (such as receiving, monitoring, transmitting) using or otherwise in cooperation with the transceiver 915, the one or more antennas 925, or any combination thereof. Although the communications manager 920 is illustrated as a separate component, in some examples, one or more functions described with reference to the communications manager 920 may be supported by or performed by the at least one processor 940, the at least one memory 930, the code 935, or any combination thereof. For example, the code 935 may include instructions executable by the at least one processor 940 to cause the wireless communication device 905 to perform various aspects of polar coding techniques for higher-order modulation as described herein, or the at least one processor 940 and the at least one memory 930 may be otherwise configured to, individually or collectively, perform or support such operations.

Figure 10:
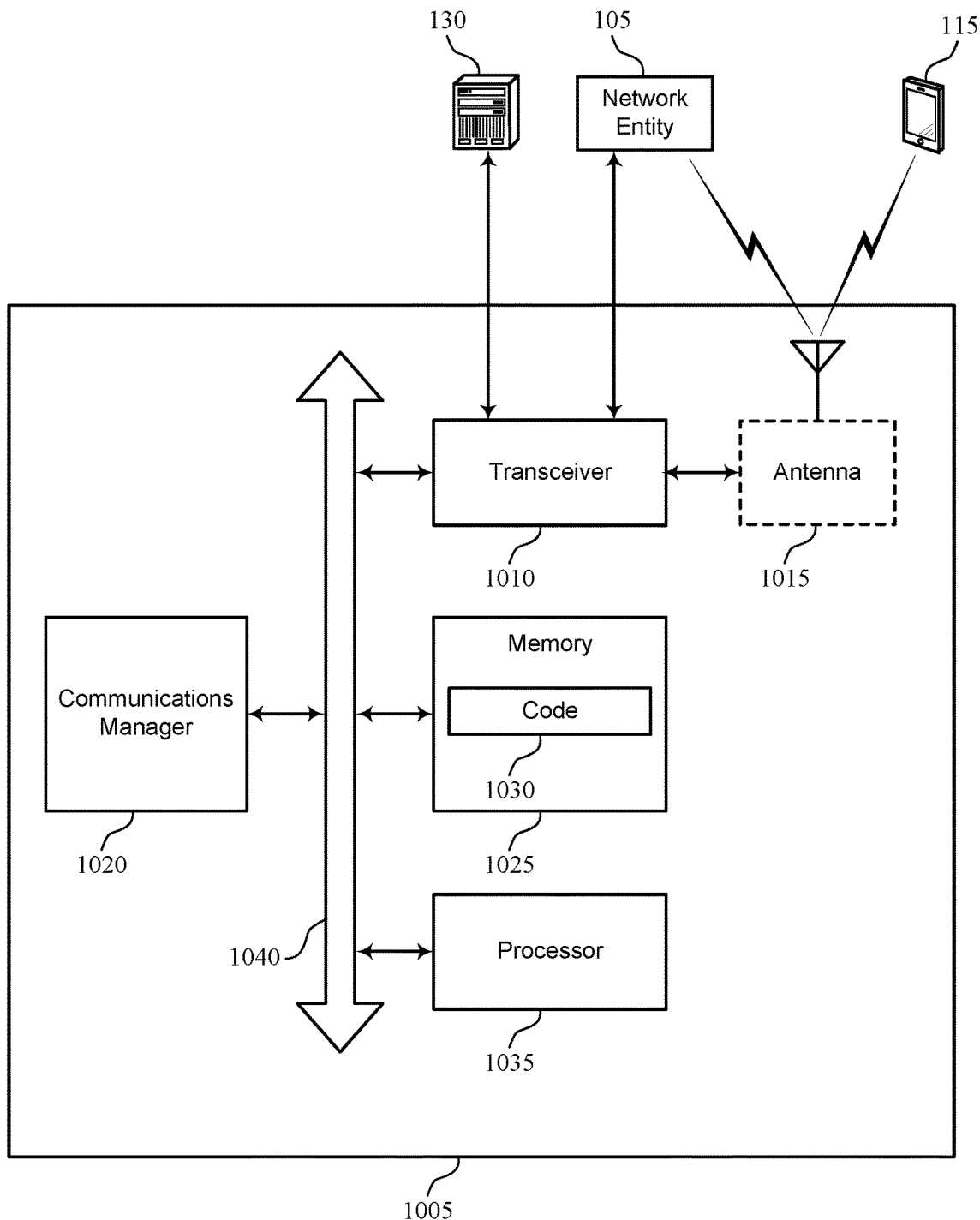

FIG. 10 shows a diagram of an example system including a wireless communication device 1005 that supports polar coding techniques for higher-order modulation schemes. The wireless communication device 1005 may be an example of or include the components of a wireless communication device 605, a wireless communication device 705, or a network entity 105 as described herein. The wireless communication device 1005 may communicate with one or more network entities 105, one or more UEs 115, or any combination thereof, which may include communications over one or more wired interfaces, over one or more wireless interfaces, or any combination thereof. The wireless communication device 1005 may include components that support outputting and obtaining communications, such as a communications manager 1020, a transceiver 1010, an antenna 1015, at least one memory 1025, code 1030, and at least one processor 1035. These components may be in electronic communication or otherwise coupled (for example, operatively, communicatively, functionally, electronically, electrically) via one or more buses (such as a bus 1040).

The transceiver 1010 may support bi-directional communications via wired links, wireless links, or both as described herein. In some examples, the transceiver 1010 may include a wired transceiver and may communicate bi-directionally with another wired transceiver. Additionally, or alternatively, in some examples, the transceiver 1010 may include a wireless transceiver and may communicate bi-directionally with another wireless transceiver. In some examples, the wireless communication device 1005 may include one or more antennas 1015, which may be capable of transmitting or receiving wireless transmissions (for example, concurrently). The transceiver 1010 may also include a modem to modulate signals, to provide the modulated signals for transmission (such as by one or more antennas 1015, by a wired transmitter), to receive modulated signals (such as from one or more antennas 1015, from a wired receiver), and to demodulate signals. In some implementations, the transceiver 1010 may include one or more interfaces, such as one or more interfaces coupled with the one or more antennas 1015 that are configured to support various receiving or obtaining operations, or one or more interfaces coupled with the one or more antennas 1015 that are configured to support various transmitting or outputting operations, or a combination thereof. In some implementations, the transceiver 1010 may include or be configured for coupling with one or more processors or one or more memory components that are operable to perform or support operations based on received or obtained information or signals, or to generate information or other signals for transmission or other outputting, or any combination thereof. In some implementations, the transceiver 1010, or the transceiver 1010 and the one or more antennas 1015, or the transceiver 1010 and the one or more antennas 1015 and one or more processors or one or more memory components (such as the at least one processor 1035, the at least one memory 1025, or both), may be included in a chip or chip assembly that is installed in the wireless communication device 1005. In some examples, the transceiver 1010 may be operable to support communications via one or more communications links (such as a communication link 125, a backhaul communication link 120, a midhaul communication link 162, a fronthaul communication link 168).

The at least one memory 1025 may include RAM, ROM, or any combination thereof. The at least one memory 1025 may store computer-readable, computer-executable code 1030 including instructions that, when executed by one or more of the at least one processor 1035, cause the wireless communication device 1005 to perform various functions described herein. The code 1030 may be stored in a non-transitory computer-readable medium such as system memory or another type of memory. In some examples, the code 1030 may not be directly executable by a processor of the at least one processor 1035 but may cause a computer (for example, when compiled and executed) to perform functions described herein. In some examples, the at least one memory 1025 may contain, among other things, a BIOS, which may control basic hardware or software operation such as the interaction with peripheral components or devices. In some examples, the at least one processor 1035 may include multiple processors and the at least one memory 1025 may include multiple memories. One or more of the multiple processors may be coupled with one or more of the multiple memories, which may, individually or collectively, be configured to perform various functions herein (for example, as part of a processing system).

The at least one processor 1035 may include an intelligent hardware device (such as a general-purpose processor, a DSP, an ASIC, a CPU, an FPGA, a microcontroller, a programmable logic device, discrete gate or transistor logic, a discrete hardware component, or any combination thereof). In some examples, the at least one processor 1035 may be configured to operate a memory array using a memory controller. In some other examples, a memory controller may be integrated into one or more of the at least one processor 1035. The at least one processor 1035 may be configured to execute computer-readable instructions stored in a memory (such as one or more of the at least one memory 1025) to cause the wireless communication device 1005 to perform various functions (such as functions or tasks supporting polar coding techniques for higher-order modulation). For example, the wireless communication device 1005 or a component of the wireless communication device 1005 may include at least one processor 1035 and at least one memory 1025 coupled with one or more of the at least one processor 1035, the at least one processor 1035 and the at least one memory 1025 configured to perform various functions described herein. The at least one processor 1035 may be an example of a cloud-computing platform (such as one or more physical nodes and supporting software such as operating systems, virtual machines, or container instances) that may host the functions (for example, by executing code 1030) to perform the functions of the wireless communication device 1005. The at least one processor 1035 may be any one or more suitable processors capable of executing scripts or instructions of one or more software programs stored in the wireless communication device 1005 (such as within one or more of the at least one memory 1025). In some implementations, the at least one processor 1035 may be a component of a processing system. A processing system may generally refer to a system or series of machines or components that receives inputs and processes the inputs to produce a set of outputs (which may be passed to other systems or components of, for example, the wireless communication device 1005). For example, a processing system of the wireless communication device 1005 may refer to a system including the various other components or subcomponents of the wireless communication device 1005, such as the at least one processor 1035, or the transceiver 1010, or the communications manager 1020, or other components or combinations of components of the wireless communication device 1005. The processing system of the wireless communication device 1005 may interface with other components of the wireless communication device 1005, and may process information received from other components (such as inputs or signals) or output information to other components. For example, a chip or modem of the wireless communication device 1005 may include a processing system and one or more interfaces to output information, or to obtain information, or both. The one or more interfaces may be implemented as or otherwise include a first interface configured to output information and a second interface configured to obtain information, or a same interface configured to output information and to obtain information, among other implementations. In some implementations, the one or more interfaces may refer to an interface between the processing system of the chip or modem and a transmitter, such that the wireless communication device 1005 may transmit information output from the chip or modem. Additionally, or alternatively, in some implementations, the one or more interfaces may refer to an interface between the processing system of the chip or modem and a receiver, such that the wireless communication device 1005 may obtain information or signal inputs, and the information may be passed to the processing system. A person having ordinary skill in the art will readily recognize that a first interface also may obtain information or signal inputs, and a second interface also may output information or signal outputs.

In some examples, a bus 1040 may support communications of (for example, within) a protocol layer of a protocol stack. In some examples, a bus 1040 may support communications associated with a logical channel of a protocol stack (for example, between protocol layers of a protocol stack), which may include communications performed within a component of the wireless communication device 1005, or between different components of the wireless communication device 1005 that may be co-located or located in different locations (for example, where the wireless communication device 1005 may refer to a system in which one or more of the communications manager 1020, the transceiver 1010, the at least one memory 1025, the code 1030, and the at least one processor 1035 may be located in one of the different components or divided between different components).

In some examples, the communications manager 1020 may manage aspects of communications with a core network 130 (such as via one or more wired or wireless backhaul links). For example, the communications manager 1020 may manage the transfer of data communications for client devices, such as one or more UEs 115. In some examples, the communications manager 1020 may manage communications with other network entities 105, and may include a controller or scheduler for controlling communications with UEs 115 in cooperation with other network entities 105. In some examples, the communications manager 1020 may support an X2 interface within an LTE/LTE-A wireless communications network technology to provide communication between network entities 105.

The communications manager 1020 may support wireless communications in accordance with examples as disclosed herein. For example, the communications manager 1020 is capable of, configured to, or operable to support a means for encoding an information bit vector into a set of multiple code blocks using a polar code that is partitioned into a set of multiple sub-blocks having a same block length in accordance with a polar transformation associated with a modulation scheme, each code block of the set of multiple code blocks being encoded using a respective sub-block of the set of multiple sub-blocks. The communications manager 1020 is capable of, configured to, or operable to support a means for interleaving respective bits of each code block of the set of multiple code blocks using a respective interleaver of a set of multiple interleavers. The communications manager 1020 is capable of, configured to, or operable to support a means for transmitting the respective interleaved bits of each code block of the set of multiple code blocks over a respective bit channel of a set of multiple bit channels, each bit channel of the set of multiple bit channels being associated with a respective reliability.

Additionally, or alternatively, the communications manager 1020 may support wireless communications in accordance with examples as disclosed herein. For example, the communications manager 1020 is capable of, configured to, or operable to support a means for receiving a signal representing a set of multiple code blocks over a set of multiple bit channels, the set of multiple code blocks encoded using a polar code that is partitioned into a set of multiple sub-blocks having a same block length in accordance with a polar transformation associated with a modulation scheme. In some examples, each bit channel of the set of multiple bit channels is associated with a respective reliability. The communications manager 1020 is capable of, configured to, or operable to support a means for de-interleaving each code block of the set of multiple code blocks using a set of multiple de-interleavers, each de-interleaver of the set of multiple de-interleavers associated with a respective code block of the set of multiple code blocks, and the set of multiple code blocks collectively including an information bit vector. The communications manager 1020 is capable of, configured to, or operable to support a means for decoding the set of multiple code blocks according to the polar code to obtain the information bit vector.

By including or configuring the communications manager 1020 in accordance with examples as described herein, the wireless communication device 1005 may support techniques partitioning a polar code into multiple sub-blocks for encoding of an information bit vector, which may result in improved communication reliability, reduced latency, improved user experience related to reduced processing, reduced power consumption, more efficient utilization of communication resources, improved coordination between devices, longer battery life, and improved utilization of processing capability, among other advantages.

In some examples, the communications manager 1020 may be configured to perform various operations (such as receiving, obtaining, monitoring, outputting, transmitting) using or otherwise in cooperation with the transceiver 1010, the one or more antennas 1015 (for example, where applicable), or any combination thereof. Although the communications manager 1020 is illustrated as a separate component, in some examples, one or more functions described with reference to the communications manager 1020 may be supported by or performed by the transceiver 1010, one or more of the at least one processor 1035, one or more of the at least one memory 1025, the code 1030, or any combination thereof (for example, by a processing system including at least a portion of the at least one processor 1035, the at least one memory 1025, the code 1030, or any combination thereof). For example, the code 1030 may include instructions executable by one or more of the at least one processor 1035 to cause the wireless communication device 1005 to perform various aspects of polar coding techniques for higher-order modulation as described herein, or the at least one processor 1035 and the at least one memory 1025 may be otherwise configured to, individually or collectively, perform or support such operations.

Figure 11:
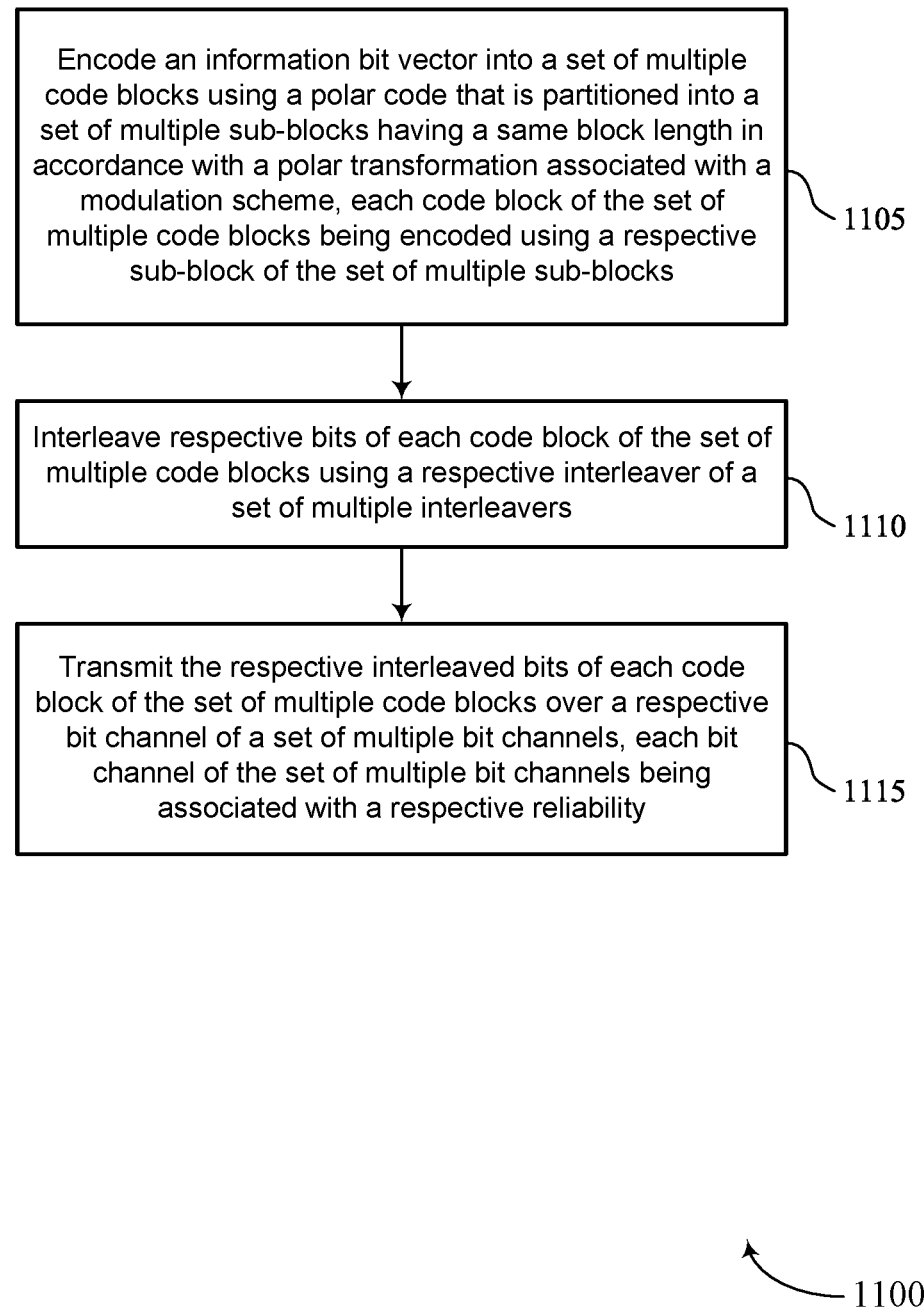
FIGS. 11 and 12 show flowcharts illustrating methods that support polar coding techniques for higher-order modulation schemes.

FIG. 11 shows a flowchart illustrating a method 1100 that supports polar coding techniques for higher-order modulation in accordance with aspects of the present disclosure. The operations of the method 1100 may be implemented by a wireless communication device, such as a UE or a network entity, or its components as described herein. For example, the operations of the method 1100 may be performed by a UE 115 or a network entity as described with reference to FIGS. 1-10. In some examples, a UE or a network entity may execute a set of instructions to control the functional elements of the UE or the network entity to perform the described functions. Additionally, or alternatively, the UE or the network entity may perform aspects of the described functions using special-purpose hardware.

At block 1105, the method may include encoding an information bit vector into a set of multiple code blocks using a polar code that is partitioned into a set of multiple sub-blocks having a same block length in accordance with a polar transformation associated with a modulation scheme, each code block of the set of multiple code blocks being encoded using a respective sub-block of the set of multiple sub-blocks. The operations of block 1105 may be performed in accordance with examples as disclosed herein. In some examples, aspects of the operations of block 1105 may be performed by an encoding component 825 as described with reference to FIG. 8.

At block 1110, the method may include interleaving respective bits of each code block of the set of multiple code blocks using a respective interleaver of a set of multiple interleavers. The operations of block 1110 may be performed in accordance with examples as disclosed herein. In some examples, aspects of the operations of block 1110 may be performed by an interleaving component 830 as described with reference to FIG. 8.

At block 1115, the method may include transmitting the respective interleaved bits of each code block of the set of multiple code blocks over a respective bit channel of a set of multiple bit channels, each bit channel of the set of multiple bit channels being associated with a respective reliability. The operations of block 1115 may be performed in accordance with examples as disclosed herein. In some examples, aspects of the operations of block 1115 may be performed by a bit channel component 835 as described with reference to FIG. 8.

Figure 12:
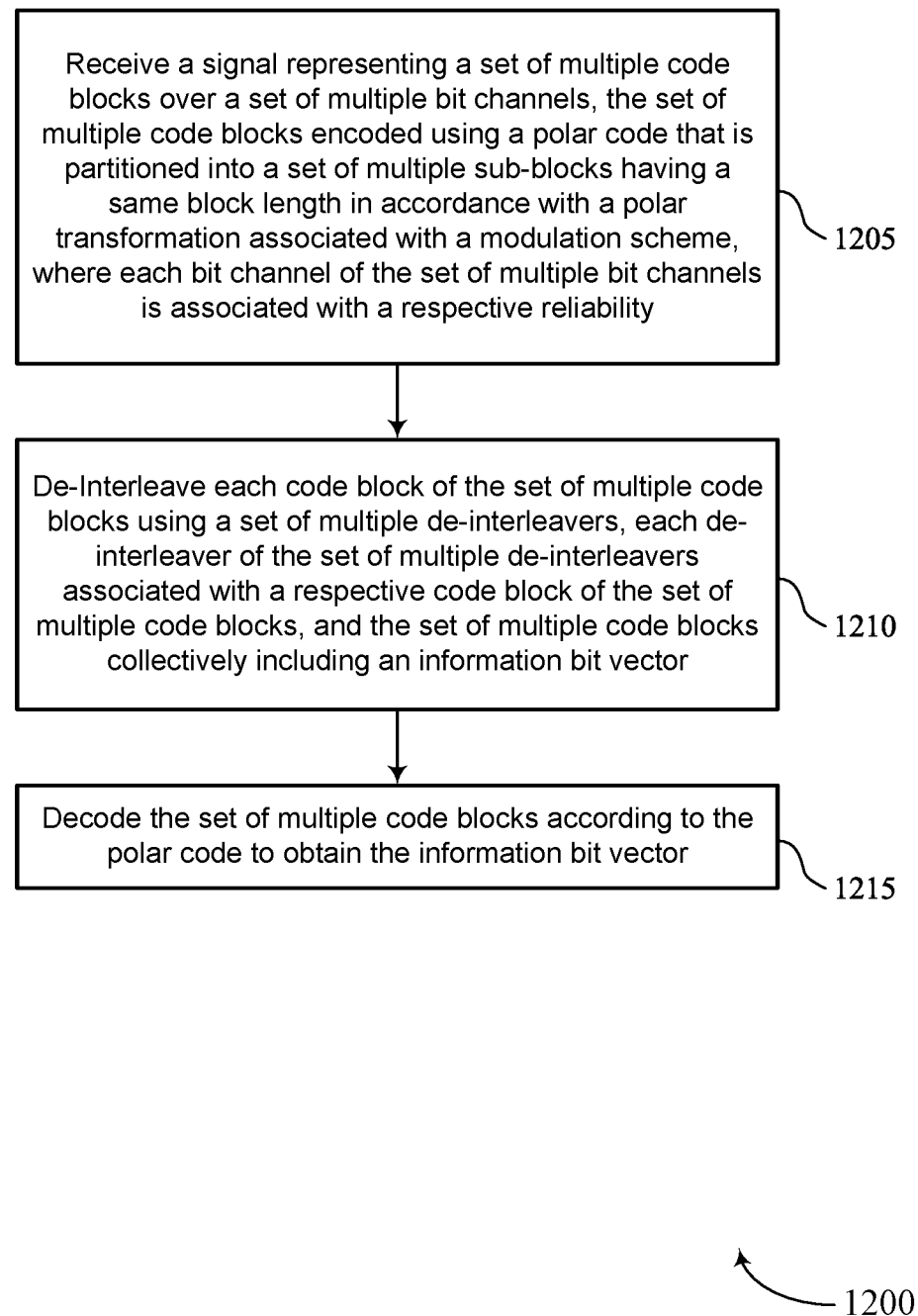

FIG. 12 shows a flowchart illustrating a method 1200 that supports polar coding techniques for higher-order modulation in accordance with aspects of the present disclosure. The operations of the method 1200 may be implemented by a wireless communication device, such as a UE or a network entity, or its components as described herein. For example, the operations of the method 1200 may be performed by a UE 115 or a network entity as described with reference to FIGS. 1-10. In some examples, a UE or a network entity may execute a set of instructions to control the functional elements of the UE or the network entity to perform the described functions. Additionally, or alternatively, the UE or the network entity may perform aspects of the described functions using special-purpose hardware.

At block 1205, the method may include receiving a signal representing a set of multiple code blocks over a set of multiple bit channels, the set of multiple code blocks encoded using a polar code that is partitioned into a set of multiple sub-blocks having a same block length in accordance with a polar transformation associated with a modulation scheme. In some examples, each bit channel of the set of multiple bit channels is associated with a respective reliability. The operations of block 1205 may be performed in accordance with examples as disclosed herein. In some examples, aspects of the operations of block 1205 may be performed by a bit channel component 835 as described with reference to FIG. 8.

At block 1210, the method may include de-interleaving each code block of the set of multiple code blocks using a set of multiple de-interleavers, each de-interleaver of the set of multiple de-interleavers associated with a respective code block of the set of multiple code blocks, and the set of multiple code blocks collectively including an information bit vector. The operations of block 1210 may be performed in accordance with examples as disclosed herein. In some examples, aspects of the operations of block 1210 may be performed by a de-interleaving component 840 as described with reference to FIG. 8.

At block 1215, the method may include decoding the set of multiple code blocks according to the polar code to obtain the information bit vector. The operations of block 1215 may be performed in accordance with examples as disclosed herein. In some examples, aspects of the operations of block 1215 may be performed by a decoding component 845 as described with reference to FIG. 8.

The following provides an overview of aspects of the present disclosure:

Aspect 1: A method for wireless communication at a wireless communication device, comprising: encoding an information bit vector into a plurality of code blocks using a polar code that is partitioned into a plurality of sub-blocks having a same block length in accordance with a polar transformation associated with a modulation scheme, each code block of the plurality of code blocks being encoded using a respective sub-block of the plurality of sub-blocks; interleaving respective bits of each code block of the plurality of code blocks using a respective interleaver of a plurality of interleavers; and transmitting the respective interleaved bits of each code block of the plurality of code blocks over a respective bit channel of a plurality of bit channels, each bit channel of the plurality of bit channels being associated with a respective reliability.

Aspect 2: The method of aspect 1, wherein encoding the information bit vector comprises: mapping bits of the information bit vector to respective bit locations associated with the plurality of sub-blocks, wherein the bits of each code block are interleaved in accordance with the respective bit locations.

Aspect 3: The method of any of aspects 1 through 2, wherein encoding the information bit vector comprises: allocating a respective quantity of bits of the information bit vector to each sub-block of the plurality of sub-blocks in accordance with reliabilities respectively associated with the bits of the information bit vector; and determining a bit position for each bit of the respective quantity of bits allocated to each sub-block of the plurality of sub-blocks, wherein each code block of the plurality of code blocks comprises the respective quantity of bits of the information bit vector in accordance with the bit positions.

Aspect 4: The method of aspect 3, wherein allocating the quantities of bits of the information bit vector to the plurality of sub-blocks comprises: determining single-bit reliabilities of respective bit channel sub-blocks for each sub-block of the plurality of sub-blocks; selecting respective subsets of the respective bit channel sub-blocks for each sub-block of the plurality of sub-blocks in accordance with the single-bit reliabilities; and dividing respective sets of bits into partitions allocated to the respective subsets of the respective bit channel sub-blocks for each sub-block of the plurality of sub-blocks in accordance with the single-bit reliabilities.

Aspect 5: The method of aspect 4, wherein determining the bit position for each bit of the respective quantity of bits comprises: determining the bit position for each bit of the partitions in each bit channel sub-block in accordance with the single-bit reliabilities.

Aspect 6: The method of any of aspects 1 through 2, wherein allocating the respective quantity of bits of the information bit vector to each sub-block of the plurality of sub-blocks comprises: dividing respective sets of bits into partitions allocated to bit channel sub-blocks for each sub-block of the plurality of sub-blocks, wherein the respective sets of bits are divided in accordance with a mutual information transfer function, and wherein the respective quantity of bits is allocated to each sub-block of the plurality of sub-blocks in accordance with the mutual information transfer function.

Aspect 7: The method of aspect 6, wherein the respective sets of bits are divided into partitions recursively, and the recursive dividing is stopped based on the bit channel sub-blocks being associated with a threshold length, and determining the bit position for each bit of the respective quantity of bits is based on the bit channel sub-blocks being associated with the threshold length.

Aspect 8: The method of any of aspects 1 through 7, wherein each code block is associated with a respective quantity of encoded bits, the method further comprising: performing rate matching for the respective quantity of the encoded bits associated with each code block in accordance with the same block length of each sub-block.

Aspect 9: The method of aspect 8, wherein performing the rate matching for the respective quantity of the encoded bits comprises: shortening a subset of the respective quantity of the encoded bits associated with each code block, the subset comprising a first quantity of the encoded bits at an end of the respective quantity of the encoded bits associated with each code block.

Aspect 10: The method of aspect 9, wherein the first quantity of the encoded bits is equal to a difference between a total block length of the polar code and a length of a codeword comprising the plurality of code blocks divided by a quantity of the plurality of bit channels.

Aspect 11: The method of aspect 8, wherein performing the rate matching for the respective quantity of the encoded bits comprises: puncturing a subset of the respective quantity of the encoded bits associated with each code block, the subset comprising a first quantity of the encoded bits at a beginning of the respective quantity of the encoded bits associated with each code block.

Aspect 12: The method of aspect 11, wherein the first quantity of the encoded bits is equal to a difference between a total block length of the polar code and a length of a codeword comprising the plurality of code blocks divided by a quantity of the plurality of bit channels.

Aspect 13: The method of aspect 8, wherein performing the rate matching for the respective quantity of the encoded bits comprises: shortening a subset of the respective quantity of the encoded bits associated with one or more code blocks from the plurality of code blocks, the subset of the respective quantity of the encoded bits comprising a first quantity of the encoded bits at an end of the respective quantity of the encoded bits associated with the one or more code blocks; and shortening all of the encoded bits associated with one or more other code blocks from the plurality of code blocks.

Aspect 14: The method of aspect 13, wherein the one or more other code blocks are associated with a capacity level of 1.

Aspect 15: The method of aspect 8, wherein performing the rate matching for the respective quantity of the encoded bits comprises: puncturing a subset of the respective quantity of the encoded bits associated with one or more code blocks from the plurality of code blocks, the subset of the respective quantity of the encoded bits comprising a first quantity of the encoded bits at a beginning of the respective quantity of the encoded bits associated with the one or more code blocks; and puncturing all of the encoded bits associated with one or more other code blocks from the plurality of code blocks.

Aspect 16: The method of aspect 15, wherein the one or more other code blocks are associated with a capacity level of 0.

Aspect 17: The method of any of aspects 1 through 16, wherein a total block length of the polar code is equal to N, and the same block length of each sub-block of the plurality of sub-blocks is equal to N divided by a quantity of the plurality of bit channels.

Aspect 18: The method of any of aspects 1 through 17, further comprising: mapping encoded bits to a constellation in accordance with a row-in column-out interleaving scheme, the encoded bits being mapped to the constellation prior to interleaving each code block using the respective interleaver of the plurality of interleavers.

Aspect 19: The method of any of aspects 1 through 18, wherein each interleaver of the plurality of interleavers is different in accordance with each interleaver being associated with different code blocks of the plurality of code blocks.

Aspect 20: A method for wireless communication at a wireless communication device, comprising: receiving a signal representing a plurality of code blocks over a plurality of bit channels, the plurality of code blocks encoded using a polar code that is partitioned into a plurality of sub-blocks having a same block length in accordance with a polar transformation associated with a modulation scheme, each bit channel of the plurality of bit channels is associated with a respective reliability; de-interleaving each code block of the plurality of code blocks using a plurality of de-interleavers, each de-interleaver of the plurality of de-interleavers associated with a respective code block of the plurality of code blocks, and the plurality of code blocks collectively comprising an information bit vector; and decoding the plurality of code blocks according to the polar code to obtain the information bit vector.

Aspect 21: The method of aspect 20, wherein bits of the information bit vector are mapped to respective bit locations associated with the plurality of sub-blocks.

Aspect 22: The method of any of aspects 20 through 21, wherein a respective quantity of bits of the information bit vector is allocated to each sub-block of the plurality of sub-blocks in accordance with reliabilities respectively associated with the bits of the information bit vector, and each code block of the plurality of code blocks comprises the respective quantity of bits of the information bit vector in accordance with bit positions.

Aspect 23: The method of aspect 22, wherein respective sets of bits are divided into partitions allocated to bit channel sub-blocks for each sub-block of the plurality of sub-blocks in accordance with single-bit reliabilities respectively associated with the bit channel sub-blocks, and the bit channel sub-blocks for each sub-block are selected from a plurality of bit channel sub-blocks in accordance with the single-bit reliabilities respectively associated with the bit channel sub-blocks.

Aspect 24: The method of aspect 22, wherein respective sets of bits are divided into partitions allocated to bit channel sub-blocks for each sub-block of the plurality of sub-blocks in accordance with a mutual information transfer function, and the respective quantity of the bits is allocated to each sub-block of the plurality of sub-blocks in accordance with the mutual information transfer function.

Aspect 25: The method of any of aspects 20 through 24, wherein each code block is associated with a respective quantity of encoded bits, the respective quantity of the encoded bits being rate matched in accordance with the same block length of each sub-block.

Aspect 26: The method of aspect 25, wherein a subset of the respective quantity of the encoded bits associated with each code block is shortened, the subset comprising a first quantity of the encoded bits at an end of the respective quantity of the encoded bits.

Aspect 27: The method of aspect 26, wherein the first quantity of the encoded bits is equal to a difference between a total block length of the polar code and a length of a codeword comprising the plurality of code blocks divided by a quantity of the plurality of bit channels.

Aspect 28: The method of aspect 25, wherein a subset of the respective quantity of the encoded bits associated with each code block is punctured, the subset comprising a first quantity of the encoded bits at a beginning of the respective quantity of the encoded bits.

Aspect 29: The method of aspect 28, wherein the first quantity of the encoded bits is equal to a difference between a total block length of the polar code and a length of a codeword comprising the plurality of code blocks divided by a quantity of the plurality of bit channels.

Aspect 30: The method of aspect 25, wherein a subset of the respective quantity of the encoded bits for one or more code blocks from the plurality of code blocks is shortened, the subset of the respective quantity of the encoded bits comprising a first quantity of the encoded bits at an end of the respective quantity of the encoded bits associated with the one or more code blocks, and all of the encoded bits associated with one or more other code blocks from the plurality of code blocks are shortened.

Aspect 31: The method of aspect 30, wherein the one or more other code blocks are associated with a capacity level of 1.

Aspect 32: The method of aspect 25, wherein a subset of the respective quantity of the encoded bits for one or more code blocks from the plurality of code blocks is punctured, the subset of the respective quantity of the encoded bits comprising a first quantity of the encoded bits at a beginning of the respective quantity of the encoded bits associated with the one or more code blocks, and all of the encoded bits associated with one or more other code blocks of the plurality of code blocks are punctured.

Aspect 33: The method of aspect 32, wherein the one or more other code blocks are associated with a capacity level of 0.

Aspect 34: The method of any of aspects 20 through 33, wherein a total block length of the polar code is equal to N, and the same block length of each sub-block of the plurality of sub-blocks is equal to N divided by a quantity of the plurality of bit channels.

Aspect 35: A wireless communication device for wireless communication, comprising a processing system that includes processor circuitry and memory circuitry that stores code, the processing system configured to cause the wireless communication device to perform a method of any of aspects 1 through 19.

Aspect 36: A wireless communication device for wireless communication, comprising at least one means for performing a method of any of aspects 1 through 19.

Aspect 37: A non-transitory computer-readable medium storing code for wireless communication, the code comprising instructions executable by one or more processors to perform a method of any of aspects 1 through 19.

Aspect 38: A wireless communication device for wireless communication, comprising a processing system that includes processor circuitry and memory circuitry that stores code, the processing system configured to cause the wireless communication device to perform a method of any of aspects 20 through 34.

Aspect 39: A wireless communication device for wireless communication, comprising at least one means for performing a method of any of aspects 20 through 34.

Aspect 40: A non-transitory computer-readable medium storing code for wireless communication, the code comprising instructions executable by one or more processors to perform a method of any of aspects 20 through 34.

It should be noted that the methods described herein describe possible examples, and that the operations and the steps may be rearranged or otherwise modified and that other examples are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed using a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor but, in the alternative, the processor may be any processor, controller, microcontroller, or state machine. A processor may also be implemented as a combination of computing devices (such as a combination of a DSP and a microprocessor, multiple microprocessors, one or more microprocessors in conjunction with a DSP core, or any other such configuration). Any functions or operations described herein as being capable of being performed by a processor may be performed by multiple processors that, individually or collectively, are capable of performing the described functions or operations.

The functions described herein may be implemented using hardware, software executed by a processor, firmware, or any combination thereof. If implemented using software executed by a processor, the functions may be stored as or transmitted using one or more instructions or code of a computer-readable medium. Other examples and examples are within the scope of the disclosure and appended claims. For example, due to the nature of software, functions described herein may be implemented using software executed by a processor, hardware, firmware, hardwiring. or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one location to another. A non-transitory storage medium may be any available medium that may be accessed by a general-purpose or special-purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc. Disks may reproduce data magnetically, and discs may reproduce data optically using lasers. Combinations of the above are also included within the scope of computer-readable media. Any functions or operations described herein as being capable of being performed by a memory may be performed by multiple memories that, individually or collectively, are capable of performing the described functions or operations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

As used herein, including in the claims, the article "a" before a noun is open-ended and understood to refer to "at least one" of those nouns or "one or more" of those nouns. The terms "a," "at least one," "one or more," "at least one of one or more" may be interchangeable. For example, if a claim recites "a component" that performs one or more functions, each of the individual functions may be performed by a single component or by any combination of multiple components. The term "a component" having characteristics or performing functions may refer to "at least one of one or more components" having a particular characteristic or performing a particular function. Subsequent reference to a component introduced with the article "a" using the terms "the" or "said" may refer to any or all of the one or more components. For example, a component introduced with the article "a" may be understood to mean "one or more components," and referring to "the component" subsequently in the claims may be understood to be equivalent to referring to "at least one of the one or more components." Similarly, subsequent reference to a component introduced as "one or more components" using the terms "the" or "said" may refer to any or all of the one or more components. For example, referring to "the one or more components" subsequently in the claims may be understood to be equivalent to referring to "at least one of the one or more components."

The term "determine" or "determining" encompasses a variety of actions and "determining" can include calculating, computing, processing, deriving, investigating, looking up (such as via looking up in a table, a database or another data structure), ascertaining, among other examples. Also, "determining" can include receiving (for example, receiving information), accessing (for example, accessing data stored in memory) among other examples. Also, "determining" can include resolving, obtaining, selecting, choosing, establishing, and other such similar actions.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. The disclosure is not limited to the examples and designs described herein but is to be accorded the broadest scope consistent with the principles and novel features disclosed herein.

What is claimed is:

1. A wireless communication device, comprising:
a processing system that includes processor circuitry and memory circuitry that stores code, the processing system configured to cause the wireless communication device to:
encode an information bit vector into a plurality of code blocks using a polar code that is partitioned into a plurality of sub-blocks having a same block length in accordance with a polar transformation associated with a modulation scheme, each code block of the plurality of code blocks being encoded using a respective sub-block of the plurality of sub-blocks;
interleave respective bits of each code block of the plurality of code blocks using a respective interleaver of a plurality of interleavers; and
transmit the respective interleaved bits of each code block of the plurality of code blocks over a respective bit channel of a plurality of bit channels, each bit channel of the plurality of bit channels being associated with a respective reliability.

2. The wireless communication device of claim 1, wherein, to encode the information bit vector, the processing system is configured to cause the wireless communication device to:
map bits of the information bit vector to respective bit locations associate with the plurality of sub-blocks, wherein the bits of each code block are interleaved in accordance with the respective bit locations.

3. The wireless communication device of claim 1, wherein, to encode the information bit vector, the processing system is configured to cause the wireless communication device to:
allocate a respective quantity of bits of the information bit vector to each sub-block of the plurality of sub-blocks in accordance with reliabilities respectively associated with the bits of the information bit vector; and
determine a bit position for each bit of the respective quantity of bits allocated to each sub-block of the plurality of sub-blocks, wherein each code block of the plurality of code blocks comprises the respective quantity of bits of the information bit vector in accordance with the bit positions.

4. The wireless communication device of claim 3, wherein, to allocate the quantities of bits of the information bit vector to the plurality of sub-blocks, the processing system is configured to cause the wireless communication device to:
- determine single-bit reliabilities of respective bit channel sub-blocks for each sub-block of the plurality of sub-blocks;
- select respective subsets of the respective bit channel sub-blocks for each sub-block of the plurality of sub-blocks in accordance with the single-bit reliabilities; and
- divide respective sets of bits into partitions allocated to the respective subsets of the respective bit channel sub-blocks for each sub-block of the plurality of sub-blocks in accordance with the single-bit reliabilities.

5. The wireless communication device of claim 4, wherein, to determine the bit position for each bit of the respective quantity of bits, the processing system is configured to cause the wireless communication device to:
- determine the bit position for each bit of the partitions in each bit channel sub-block in accordance with the single-bit reliabilities.

6. The wireless communication device of claim 3, wherein, to allocate the respective quantity of bits of the information bit vector to each sub-block of the plurality of sub-blocks, the processing system is configured to cause the wireless communication device to:
- divide respective sets of bits into partitions allocated to bit channel sub-blocks for each sub-block of the plurality of sub-blocks, wherein the respective sets of bits are divided in accordance with a mutual information transfer function, and wherein the respective quantity of bits is allocated to each sub-block of the plurality of sub-blocks in accordance with the mutual information transfer function.

7. The wireless communication device of claim 6, wherein the respective sets of bits are divided into partitions recursively, and wherein the recursive dividing is stopped in accordance with the bit channel sub-blocks being associated with a threshold length, and wherein determining the bit position for each bit of the respective quantity of bits is in accordance with the bit channel sub-blocks being associated with the threshold length.

8. The wireless communication device of claim 1, wherein each code block is associated with a respective quantity of encoded bits, and the processing system is further configured to cause the wireless communication device to:
- perform rate matching for the respective quantity of the encoded bits associated with each code block in accordance with the same block length of each sub-block.

9. The wireless communication device of claim 8, wherein, to perform the rate matching for the respective quantity of the encoded bits, the processing system is configured to cause the wireless communication device to:
- shorten a subset of the respective quantity of the encoded bits associated with each code block, the subset comprising a first quantity of the encoded bits at an end of the respective quantity of the encoded bits associated with each code block.

10. The wireless communication device of claim 9, wherein the first quantity of the encoded bits is equal to a difference between a total block length of the polar code and a length of a codeword comprising the plurality of code blocks divided by a quantity of the plurality of bit channels.

11. The wireless communication device of claim 8, wherein, to perform the rate matching for the respective quantity of the encoded bits, the processing system is configured to cause the wireless communication device to:
- puncture a subset of the respective quantity of the encoded bits associated with each code block, the subset comprising a first quantity of the encoded bits at a beginning of the respective quantity of the encoded bits associated with each code block.

12. The wireless communication device of claim 11, wherein the first quantity of the encoded bits is equal to a difference between a total block length of the polar code and a length of a codeword comprising the plurality of code blocks divided by a quantity of the plurality of bit channels.

13. The wireless communication device of claim 8, wherein, to perform the rate matching for the respective quantity of the encoded bits, the processing system is configured to cause the wireless communication device to:
- shorten a subset of the respective quantity of the encoded bits associated with one or more code blocks from the plurality of code blocks, the subset of the respective quantity of the encoded bits comprising a first quantity of the encoded bits at an end of the respective quantity of the encoded bits associated with the one or more code blocks; and
- shorten all of the encoded bits associated with one or more other code blocks from the plurality of code blocks.

14. The wireless communication device of claim 13, wherein the one or more other code blocks are associated with a capacity level of 1.

15. The wireless communication device of claim 8, wherein, to perform the rate matching for the respective quantity of the encoded bits the processing system is configured to cause the wireless communication device to:
- puncture a subset of the respective quantity of the encoded bits associated with one or more code blocks from the plurality of code blocks, the subset of the respective quantity of the encoded bits comprising a first quantity of the encoded bits at a beginning of the respective quantity of the encoded bits associated with the one or more code blocks; and
- puncture all of the encoded bits associated with one or more other code blocks from the plurality of code blocks.

16. The wireless communication device of claim 15, wherein the one or more other code blocks are associated with a capacity level of 0.

17. The wireless communication device of claim 1, wherein a total block length of the polar code is equal to N, and wherein the same block length of each sub-block of the plurality of sub-blocks is equal to N divided by a quantity of the plurality of bit channels.

18. The wireless communication device of claim 1, wherein the processing system is further configured to cause the wireless communication device to:
- map encode bits to a constellation in accordance with a row-in column-out interleaving scheme, the encoded bits being mapped to the constellation prior to interleaving each code block using the respective interleaver of the plurality of interleavers.

19. The wireless communication device of claim 1, wherein each interleaver of the plurality of interleavers is different in accordance with each interleaver being associated with different code blocks of the plurality of code blocks.

20. A method for wireless communication by a wireless communication device, comprising:
- encoding an information bit vector into a plurality of code blocks using a polar code that is partitioned into a plurality of sub-blocks having a same block length in accordance with a polar transformation associated with a modulation scheme, each code block of the plurality of code blocks being encoded using a respective sub-block of the plurality of sub-blocks;

interleaving respective bits of each code block of the plurality of code blocks using a respective interleaver of a plurality of interleavers; and transmitting the respective interleaved bits of each code block of the plurality of code blocks over a respective bit channel of a plurality of bit channels, each bit channel of the plurality of bit channels being associated with a respective reliability.

21. The method of claim 20, wherein encoding the information bit vector comprises:

mapping bits of the information bit vector to respective bit locations associate with the plurality of sub-blocks, wherein the bits of each code block are interleaved in accordance with the respective bit locations.

22. The method of claim 20, wherein encoding the information bit vector comprises:

allocating a respective quantity of bits of the information bit vector to each sub-block of the plurality of sub-blocks in accordance with reliabilities respectively associated with the bits of the information bit vector; and determining a bit position for each bit of the respective quantity of bits allocated to each sub-block of the plurality of sub-blocks, wherein each code block of the plurality of code blocks comprises the respective quantity of bits of the information bit vector in accordance with the bit positions.

23. The method of claim 22, wherein allocating the quantities of bits of the information bit vector to the plurality of sub-blocks comprises:

determining single-bit reliabilities of respective bit channel sub-blocks for each sub-block of the plurality of sub-blocks;

selecting respective subsets of the respective bit channel sub-blocks for each sub-block of the plurality of sub-blocks in accordance with the single-bit reliabilities; and dividing respective sets of bits into partitions allocated to the respective subsets of the respective bit channel sub-blocks for each sub-block of the plurality of sub-blocks in accordance with the single-bit reliabilities.

24. The method of claim 23, wherein determining the bit position for each bit of the respective quantity of bits comprises:

determining the bit position for each bit of the partitions in each bit channel sub-block in accordance with the single-bit reliabilities.

25. The method of claim 22, wherein allocating the respective quantity of bits of the information bit vector to each sub-block of the plurality of sub-blocks comprises:

dividing respective sets of bits into partitions allocated to bit channel sub-blocks for each sub-block of the plurality of sub-blocks, wherein the respective sets of bits are divided in accordance with a mutual information transfer function, and wherein the respective quantity of bits is allocated to each sub-block of the plurality of sub-blocks in accordance with the mutual information transfer function.

26. The method of claim 25, wherein the respective sets of bits are divided into partitions recursively, and wherein the recursive dividing is stopped in accordance with the bit channel sub-blocks being associated with a threshold length, and wherein determining the bit position for each bit of the respective quantity of bits is in accordance with the bit channel sub-blocks being associated with the threshold length.

27. The method of claim 20, wherein each code block is associated with a respective quantity of encoded bits, and wherein the method further comprises:

performing rate matching for the respective quantity of the encoded bits associated with each code block in accordance with the same block length of each sub-block.

28. The method of claim 27, wherein performing the rate matching for the respective quantity of the encoded bits comprises:

shortening a subset of the respective quantity of the encoded bits associated with each code block, the subset comprising a first quantity of the encoded bits at an end of the respective quantity of the encoded bits associated with each code block.

29. A wireless communication device, comprising:

means for encoding an information bit vector into a plurality of code blocks using a polar code that is partitioned into a plurality of sub-blocks having a same block length in accordance with a polar transformation associated with a modulation scheme, each code block of the plurality of code blocks being encoded using a respective sub-block of the plurality of sub-blocks;

means for interleaving respective bits of each code block of the plurality of code blocks using a respective interleaver of a plurality of interleavers; and means for transmitting the respective interleaved bits of each code block of the plurality of code blocks over a respective bit channel of a plurality of bit channels, each bit channel of the plurality of bit channels being associated with a respective reliability.

30. A non-transitory computer-readable medium storing code for wireless communication, the code comprising instructions executable by one or more processors to:

encode an information bit vector into a plurality of code blocks using a polar code that is partitioned into a plurality of sub-blocks having a same block length in accordance with a polar transformation associated with a modulation scheme, each code block of the plurality of code blocks being encoded using a respective sub-block of the plurality of sub-blocks;

interleave respective bits of each code block of the plurality of code blocks using a respective interleaver of a plurality of interleavers; and transmit the respective interleaved bits of each code block of the plurality of code blocks over a respective bit channel of a plurality of bit channels, each bit channel of the plurality of bit channels being associated with a respective reliability.

* * * * *